United States Patent
Wada et al.

(10) Patent No.: US 8,981,385 B2
(45) Date of Patent: Mar. 17, 2015

(54) SILICON CARBIDE SEMICONDUCTOR DEVICE

(71) Applicant: Sumitomo Electric Industries, Ltd., Osaka (JP)

(72) Inventors: Keiji Wada, Osaka (JP); Takeyoshi Masuda, Osaka (JP); Toru Hiyoshi, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 14/104,975

(22) Filed: Dec. 12, 2013

(65) Prior Publication Data

US 2014/0197422 A1  Jul. 17, 2014

Related U.S. Application Data

(60) Provisional application No. 61/753,213, filed on Jan. 16, 2013.

(30) Foreign Application Priority Data

Jan. 16, 2013 (JP) .................................. 2013-005132

(51) Int. Cl.
  *H01L 21/00* (2006.01)
  *H01L 29/06* (2006.01)
  *H01L 29/16* (2006.01)
  *H01L 29/872* (2006.01)

(52) U.S. Cl.
  CPC ........ *H01L 29/0619* (2013.01); *H01L 29/1608* (2013.01); *H01L 29/872* (2013.01)
  USPC .............................. 257/77; 257/734; 257/495

(58) Field of Classification Search
  USPC ........................................... 257/77, 734, 495
  See application file for complete search history.

(56) References Cited

U.S. PATENT DOCUMENTS 5,994,754 A    11/1999  Hayashi et al.
8,304,901 B2 *  11/2012  Watanabe et al. ............. 257/734
(Continued)

FOREIGN PATENT DOCUMENTS

JP    10-200090 A    7/1998
JP   2003-101039 A   4/2003
(Continued)

OTHER PUBLICATIONS

International Search Report and Written Opinion in PCT/JP2013/081497, dated Dec. 24, 2013.
(Continued)

*Primary Examiner* — Laura Menz
(74) *Attorney, Agent, or Firm* — Venable LLP; Michael A. Sartori; Tamatane J. Aga

(57) ABSTRACT

A silicon carbide semiconductor device includes a silicon carbide substrate. The silicon carbide substrate is composed of an element region provided with a semiconductor element portion and a termination region surrounding the element region as viewed in a plan view. The semiconductor element portion includes a drift region having a first conductivity type. The termination region includes a first electric field relaxing region contacting the element region and having a second conductivity type different from the first conductivity type, and a second electric field relaxing region arranged outside the first electric field relaxing region as viewed in the plan view, having the second conductivity type, and spaced from the first electric field relaxing region. A ratio calculated by dividing a width of the first electric field relaxing region by a thickness of the drift region is not less than 0.5 and not more than 1.83.

5 Claims, 22 Drawing Sheets

(56) References Cited

U.S. PATENT DOCUMENTS

| | | |
|---|---|---|
| 2003/0067033 A1 | 4/2003 | Kinoshita et al. |
| 2004/0173820 A1 | 9/2004 | Kinoshita et al. |
| 2008/0258152 A1 | 10/2008 | Yamamoto et al. |
| 2011/0233714 A1 | 9/2011 | Lu |
| 2012/0097980 A1 | 4/2012 | Masuda et al. |

FOREIGN PATENT DOCUMENTS

| | | | |
|---|---|---|---|
| JP | 2008-270412 A | 11/2008 | |
| JP | 2011-171374 A | 9/2011 | |
| JP | 2011-204710 A | 10/2011 | |
| JP | 2012-195324 A | 10/2012 | |
| JP | 2012-195519 A | 10/2012 | |
| WO | WO 2009116444 | * 9/2009 | H01L 23/48 |

OTHER PUBLICATIONS

Hiroyuki Matsunami et al., "Semiconductor SiC Technology and Applications, the Second Edition," Nikkan Kogyo Shimbun, Ltd., Sep. 20, 2011, pp. 352-353.

* cited by examiner

SILICON CARBIDE SEMICONDUCTOR DEVICE

BACKGROUND OF THE INVENTION

1. Field of the Invention

The present invention relates to a silicon carbide semiconductor device, and more particularly to a silicon carbide semiconductor device having a termination region.

2. Description of the Background Art

In recent years, in order to achieve a high breakdown voltage and low loss of semiconductor devices such as a MOSFET (Metal Oxide Semiconductor Field Effect Transistor), use thereof in a high temperature environment, and the like, silicon carbide has been adopted as a material for semiconductor devices. Silicon carbide is a wide band gap semiconductor having a band gap larger than that of silicon, which has been conventionally widely used as a material for semiconductor devices. Hence, by adopting silicon carbide as a material for a semiconductor device, the semiconductor device can have a high breakdown voltage, reduced ON resistance, and the like. Further, the semiconductor device adopting silicon carbide as its material has an advantage that its characteristics are less likely to be deteriorated when it is used in the high temperature environment, when compared with a semiconductor device adopting silicon as its material.

For example, Japanese Patent Laying-Open No. 2003-101039 describes a high breakdown voltage silicon carbide semiconductor device including a plurality of guard rings provided concentrically, and a region provided inside an innermost guard ring portion and having an impurity concentration higher than that in the innermost guard ring portion. Further, Japanese Patent Laying-Open No. 2008-270412 discloses a silicon carbide SBD (Schottky Barrier Diode) including a plurality of p type guard ring portions provided on an outer peripheral side of a p type RESURF portion.

In addition, "Semiconductor SiC Technology and Applications, the Second Edition" by Hiroyuki Matsunami, et al., Nikkan Kogyo Shimbun, Ltd., Sep. 20, 2011, pp. 352 to 353 describes a silicon carbide SBD having a JTE (Junction Termination Extension) region configured to alleviate electric field strength by forming a p type layer with a concentration low enough to be depleted. The above document describes that a breakdown voltage is improved by forming guard ring portions having impurity concentrations which become lower toward the outside.

In order to increase the breakdown voltage of a silicon carbide semiconductor device, it is necessary to widen a termination region of the silicon carbide semiconductor device. However, if the termination region of the silicon carbide semiconductor device is simply widened, an element region of the silicon carbide semiconductor device is narrowed.

SUMMARY OF THE INVENTION

The present invention has been made in view of the aforementioned problem, and one object of the present invention is to provide a silicon carbide semiconductor device capable of improving a breakdown voltage without narrowing an element region too much.

The inventors of the present invention have earnestly studied the relation between the structure of a termination region of a silicon carbide semiconductor device and electric field strength. As a result, the inventors have obtained the following finding and found the present invention. The inventors performed a simulation of electric field strengths, with the width of the termination region being maintained constant, and with the width of a JTE region and the number of guard ring portions being changed. As a result, it has been found that, when a ratio calculated by dividing the width of the JTE region by the thickness of a drift region is more than a certain value, an electric field strength at an end portion of the JTE region is sharply decreased. Further, it has also been found that, when the ratio calculated by dividing the width of the JTE region by the thickness of the drift region is more than a certain value, an electric field strength at an end portion of an outermost guard ring portion is sharply increased.

Specifically, referring to FIG. 1, an electric field strength at a corner portion of a well region (a position A) in an element region of a MOSFET, an electric field strength at a contact point between the well region and a corner portion of the JTE region (a first electric field relaxing region) (a position B), an electric field strength at a corner portion of the JTE region (the first electric field relaxing region) on an outer peripheral side (a position C) in the termination region of the MOSFET, and an electric field strength at a corner portion of the outermost guard ring portion on the outer peripheral side (a position D) were calculated, and the electric field strengths at these positions were compared.

As a result of the simulation of the electric field strengths, it has been found that, when the ratio calculated by dividing the width of the JTE region by the thickness of the drift region is not less than 0.5, the electric field strength at a boundary region between the well region and the JTE region is sharply decreased. Further, it has also been found that, when the ratio calculated by dividing the width of the JTE region by the thickness of the drift region is more than 1.83, the electric field strength at the corner portion of the outermost guard ring portion on the outer peripheral side is sharply increased. That is, when the ratio calculated by dividing the width of the JTE region by the thickness of the drift region is not less than 0.5 and not more than 1.83, both of the electric field strengths at the boundary region between the well region and the JTE region and at the corner portion of the guard ring portion can be decreased.

A silicon carbide semiconductor device in accordance with the present invention includes a silicon carbide substrate. The silicon carbide substrate is composed of an element region provided with a semiconductor element portion and a termination region surrounding the element region as viewed in a plan view. The semiconductor element portion includes a drift region having a first conductivity type. The termination region includes a first electric field relaxing region contacting the element region and having a second conductivity type different from the first conductivity type, and a second electric field relaxing region arranged outside the first electric field relaxing region as viewed in the plan view, having the second conductivity type, and spaced from the first electric field relaxing region. A ratio calculated by dividing a width of the first electric field relaxing region by a thickness of the drift region is not less than 0.5 and not more than 1.83. It is noted that, in the present invention, a width indicates a distance in a direction parallel to a first main surface of the silicon carbide substrate, and a thickness indicates a distance in a direction perpendicular to the first main surface of the silicon carbide substrate.

According to the silicon carbide semiconductor device in accordance with the present invention, the ratio calculated by dividing the width of the first electric field relaxing region by the thickness of the drift region is not less than 0.5 and not more than 1.83. Thereby, electric field strengths in both of the first electric field relaxing region and the second electric field relaxing region can be decreased. As a result, a breakdown voltage can be improved without narrowing the element region of the silicon carbide semiconductor device too much.

Preferably, in the silicon carbide semiconductor device described above, the second electric field relaxing region includes a plurality of guard ring portions. Thereby, the electric field strength in the termination region can be further decreased.

Preferably, in the silicon carbide semiconductor device described above, each of the plurality of guard ring portions has a width smaller than the width of the first electric field relaxing region. Thereby, the electric field strength in the termination region can be further decreased.

Preferably, in the silicon carbide semiconductor device described above, in a case where any two guard ring portions are selected from among the plurality of guard ring portions, the guard ring portion arranged on an outer peripheral side as viewed in the plan view has a width which is not more than that of the guard ring portion arranged on an inner peripheral side, and the guard ring portion arranged on an outermost peripheral side has a width which is smaller than that of the guard ring portion arranged on an innermost peripheral side.

Thereby, changes in electric field contour lines in a direction from the center of the silicon carbide substrate toward the outer periphery thereof become moderate. As a result, breakdown voltage life (reliability) when a voltage is repeatedly applied can be improved.

Preferably, in the silicon carbide semiconductor device described above, the number of the plurality of guard ring portions is not less than 6 and not more than 15. Thereby, the electric field strength in the termination region can be decreased efficiently.

Preferably, in the silicon carbide semiconductor device described above, the number of the plurality of guard ring portions is not less than 12 and not more than 15. Thereby, the electric field strength in the termination region can be decreased efficiently.

Preferably, in the silicon carbide semiconductor device described above, the silicon carbide semiconductor device is any of a MOSFET, an IGBT (Insulated Gate Bipolar Transistor), a schottky barrier diode, and a P/N diode. Thereby, a MOSFET, an IGBT, a schottky barrier diode, and a P/N diode capable of improving a breakdown voltage without narrowing an element region too much can be obtained.

According to the present invention, a silicon carbide semiconductor device capable of improving a breakdown voltage without narrowing an element region too much can be provided.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
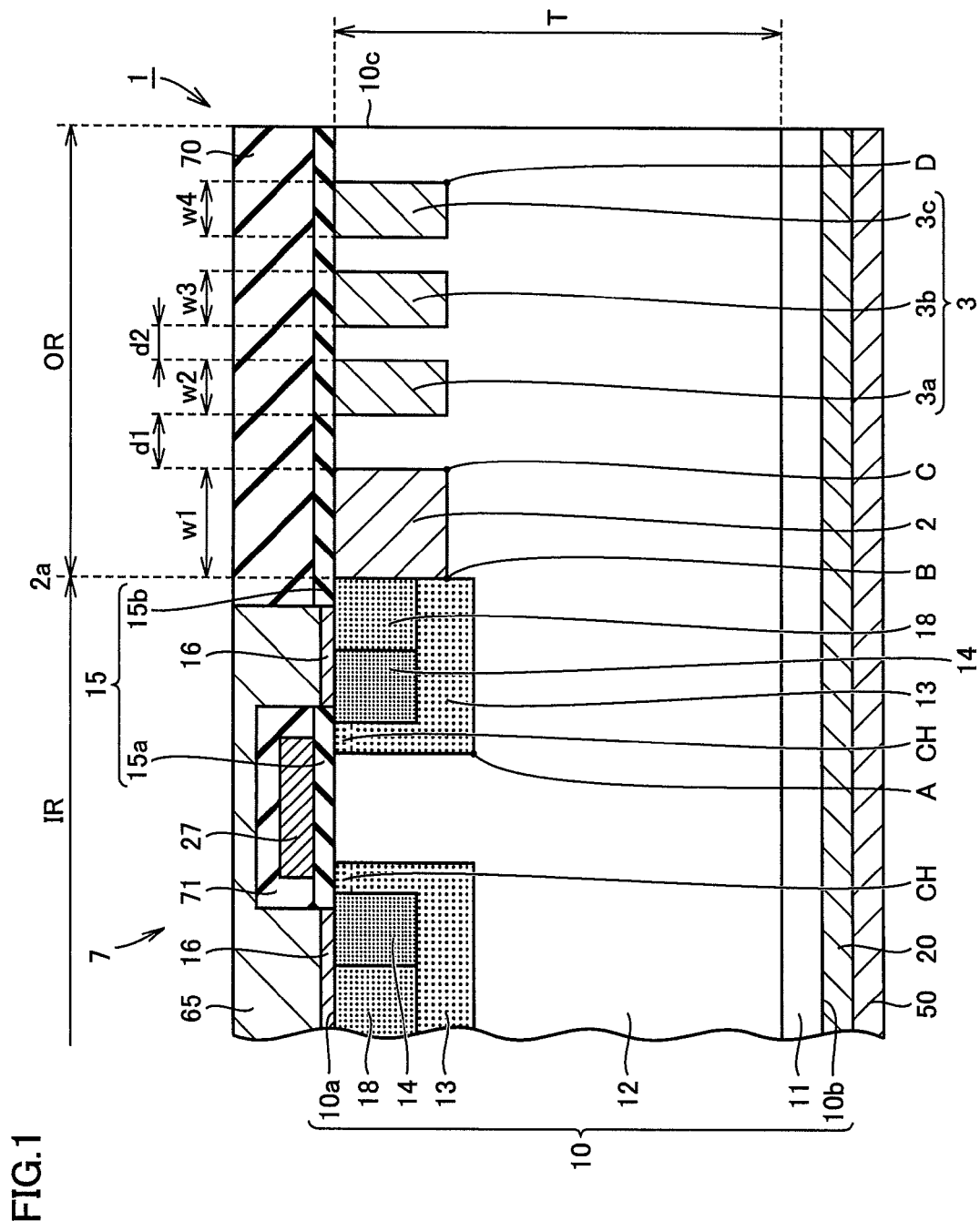
FIG. 1 is a schematic cross sectional view schematically showing a structure of a MOSFET in accordance with Embodiment 1 of the present invention.

The following describes embodiments of the present invention with reference to the drawings. It should be noted that, in the below-mentioned drawings, the same or corresponding portions are given the same reference characters and are not described repeatedly. Further, in the crystallographic description in the present specification, an individual orientation is represented by [ ], a group orientation is represented by < >, an individual plane is represented by ( ) and a group plane is represented by { }. In addition, a negative index is supposed to be crystallographically indicated by putting "-" (bar) above a numeral, but is indicated by putting the negative sign before the numeral in the present specification. For description of an angle, a system in which an omnidirectional angle is 360° is employed.

(Embodiment 1)

Firstly, a configuration of a MOSFET 1 as a silicon carbide semiconductor device in accordance with Embodiment 1 of the present invention will be described.

Referring to FIG. 1, MOSFET 1 mainly has a silicon carbide substrate 10, an insulating film 15, a gate electrode 27, a source electrode 16, and a drain electrode 20.

Figure 2:
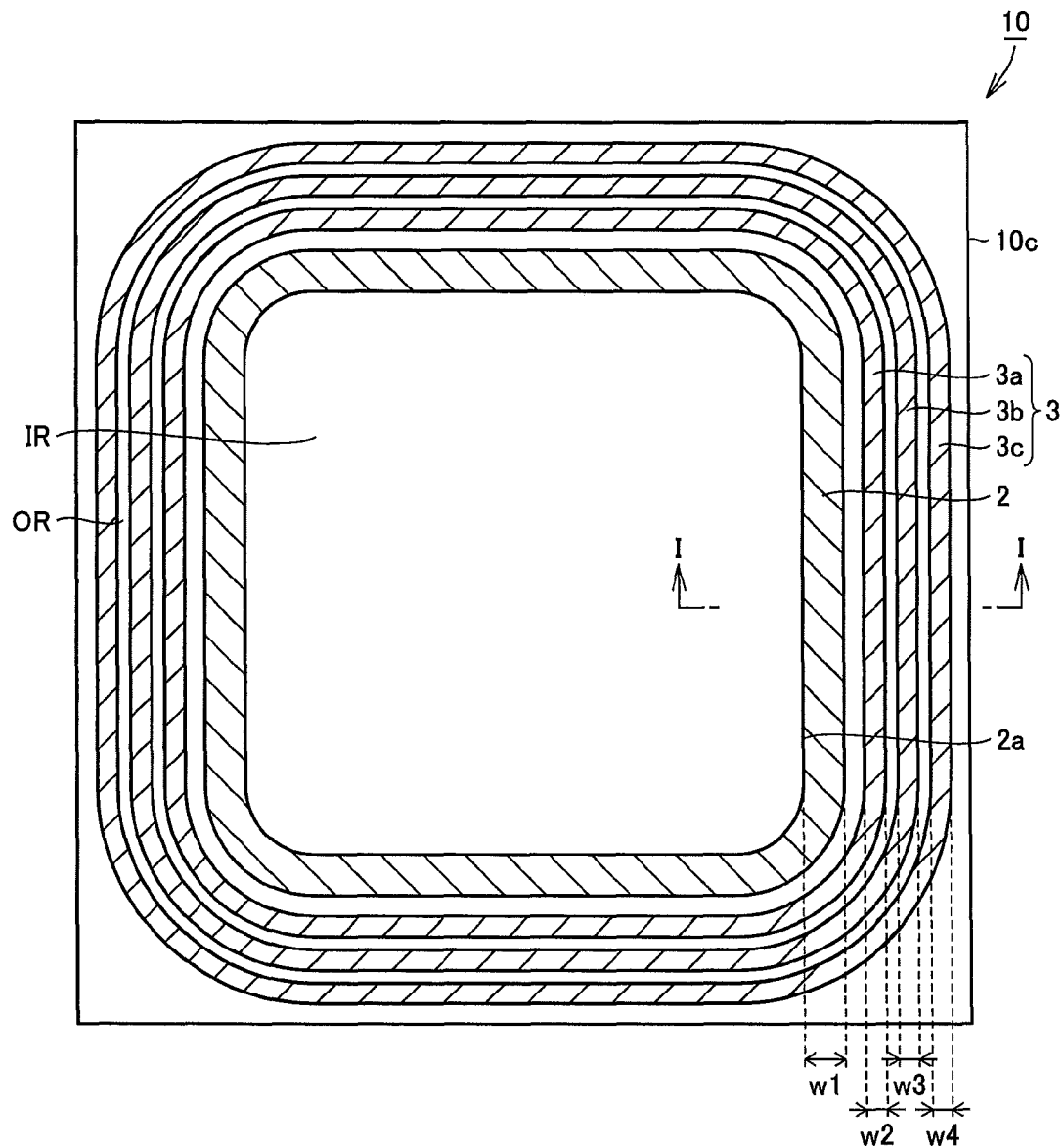
FIG. 2 is a schematic plan view schematically showing the structure of the MOSFET in accordance with Embodiment 1 of the present invention.

Referring to FIGS. 1 and 2, silicon carbide substrate 10 of MOSFET 1 is composed of an element region IR (active region) and a termination region OR (invalid region) surrounding element region IR as viewed in a plan view. Termination region OR includes a first electric field relaxing region 2 and a second electric field relaxing region 3. Element region IR is provided with a MOSFET portion as a semiconductor element portion 7. Semiconductor element portion 7 includes a drift region 12 having n type (a first conductivity type).

First electric field relaxing region 2 is a JTE region, and is a region contacting element region IF and having p type (a second conductivity type) different from n type (the first conductivity type). Second electric field relaxing region 3 is a guard ring region, and is arranged outside the first electric field relaxing region as viewed in a plan view and has p type. Second electric field relaxing region 3 is provided to be spaced from first electric field relaxing region 2.

The concentration of an impurity contained in each of first electric field relaxing region 2 and second electric field relaxing region 3 is lower than the impurity concentration in a well region. The dose amount in each of first electric field relaxing region 2 and second electric field relaxing region 3 is, for example, not less than $1.3 \times 10^{13}$ cm$^{-2}$ and not more than $1.4 \times 10^{13}$ cm$^{-2}$. A width W1 of first electric field relaxing region 2 is preferably not less than about 15 μm and not more than about 55 μm, more preferably not less than about 31 μm and not more than about 55 μm, and may be not less than about 15 μm and not more than about 39 μm. The thickness of each of first electric field relaxing region 2 and second electric field relaxing region 3 is, for example, not less than about 0.5 μm and not more than about 0.8 μm.

Preferably, second electric field relaxing region 3 includes a plurality of guard ring portions 3a, 3b, 3c. Second electric field relaxing region 3 is preferably composed of not less than 6 and not more than 15 guard ring portions, more preferably composed of not less than 9 and not more than 15 guard ring portions, and further preferably composed of not less than 12 and not more than 15 guard ring portions. It is noted that the breakdown voltage of MOSFET 1 in the present embodiment is, for example, not less than about 1.7 kV and not more than about 4.0 kV, and may be, for example, not less than about 2.2 kV and not more than about 3.8 kV.

Silicon carbide substrate 10 is made of, for example, hexagonal silicon carbide of polytype 4H, and has a first main surface 10a and a second main surface 10b opposite to each other. Semiconductor element portion 7 in element region IR of silicon carbide substrate 10 mainly has an n$^+$ substrate 11, drift region 12, a well region 13, a source region 14, and a p$^+$ region 18.

N$^+$ substrate 11 is a substrate made of, for example, hexagonal silicon carbide of polytype 4H, and having n type conductivity. N$^+$ substrate 11 contains an impurity such as, for example, N (nitrogen), in a high concentration. The concentration of the impurity such as nitrogen contained in n$^+$ substrate 11 is, for example, about $1.0 \times 10^{18}$ cm$^{-3}$. It is noted that, in a case where an n type region such as n$^+$ substrate 11 contains a donor impurity such as nitrogen and an acceptor impurity such as aluminum, the impurity concentration in the n type region is calculated as: impurity concentration=impurity concentration of the donor impurity ($N_d$)—impurity concentration of the acceptor impurity ($N_a$).

Drift region 12 is an epitaxial layer made of, for example, hexagonal silicon carbide of polytype 4H, and having n type (the first conductivity type). The impurity contained in drift region 12 is, for example, nitrogen. The impurity concentration in drift region 12 is lower than the impurity concentration in n$^+$ substrate 11. The concentration of the impurity such as nitrogen contained in drift region 12 is, for example, not less than about $2.0 \times 10^{15}$ cm$^{-3}$ and not more than about $5.0 \times 10^{15}$ cm$^{-3}$. A thickness T of drift region 12 is preferably not less than about 20 μm and not more than about 35 μm, and more preferably not less than about 23 μm and not more than about 30 μm.

A ratio calculated by dividing width W1 of JTE region 2 as the first electric field relaxing region by thickness T of drift region 12 is not less than 0.5 and not more than 1.83, and preferably not less than 1.03 and not more than 1.83. The ratio calculated by dividing width W1 of JTE region 2 as the first electric field relaxing region by thickness T of drift region 12 may be not less than 0.65 and not more than 1.70.

Well region 13 is a region having p type different from n type. The impurity contained in well region 13 is, for example, Al (aluminum), B (boron), or the like. Preferably, the concentration of the impurity such as aluminum contained in a surface of well region 13 (i.e., first main surface 10a) is not less than about $1 \times 10^{16}$ cm$^{-3}$ and not more than about $5 \times 10^{17}$ cm$^{-3}$. Further, the impurity concentration in a deep portion of well region 13 is about $1 \times 10^{18}$ cm$^{-3}$. The thickness of well region 13 is, for example, not less than about 0.5 μm and not more than about 1.0 μm. Well region 13 is in contact with first electric field relaxing region 2 at a boundary line 2a between element region IR and termination region OR. It is noted that, in a case where a p type region such as well region 13 contains a donor impurity such as nitrogen and an acceptor impurity such as aluminum, the impurity concentration in the p type region is calculated as: impurity concentration=impurity concentration of the acceptor impurity ($N_a$)—impurity concentration of the donor impurity ($N_d$).

Source region 14 is a region having n type. Source region 14 is separated from drift region 12 by well region 13. Further, source region 14 is formed inside well region 13 to include first main surface 10a and to be surrounded by well region 13. Source region 14 contains an impurity such as, for example, P (phosphorus), in a concentration of, for example, about $1\times10^{20}$ cm$^{-3}$. The concentration of the impurity contained in source region 14 is higher than the concentration of the impurity contained in drift region 12.

P$^+$ region 18 is a region having p type. P$^+$ region 18 is formed in contact with well region 13 and source region 14. P$^+$ region 18 contains an impurity such as, for example, aluminum or boron, in a concentration of, for example, about $1\times10^{20}$ cm$^{-3}$. The concentration of the impurity contained in p$^+$ region 18 is higher than the concentration of the impurity contained in well region 13.

Insulating film 15 includes a gate insulating film portion 15a provided at a position facing channel regions CH formed in well regions 13, and an insulating film portion 15b exposed at an end portion 10c of silicon carbide substrate 10 and contacting first electric field relaxing region 2 and second electric field relaxing region 3. Gate insulating film portion 15a is formed in contact with well regions 13, source regions 14, and drift region 12 to extend from an upper surface of one source region 14 to an upper surface of the other source region 14. Insulating film 15 is made of, for example, silicon dioxide. Preferably, the thickness of insulating film 15 (i.e., the distance of insulating film 15 along the direction of the normal to first main surface 10a) is not less than about 45 nm and not more than about 55 nm.

Gate electrode 27 is arranged on and in contact with gate insulating film portion 15a to extend from above one source region 14 to above the other source region 14. Gate electrode 27 is made of a conductor such as, for example, polysilicon doped with an impurity, or aluminum.

Source electrode 16 is in contact with insulating film 15, source region 14, and p$^+$ region 18. Preferably, source electrode 16 is made of a material having nickel and silicon. Source electrode 16 may be made of a material having titanium, aluminum, and silicon. Preferably, source electrode 16 is in ohmic contact with source region 14 and p$^+$ region 18.

Drain electrode 20 is formed in contact with second main surface 10b of silicon carbide substrate 10. Drain electrode 20 may have the same configuration as that of, for example, source electrode 16, or may be made of another material such as nickel that can make ohmic contact with n$^+$ substrate 11. Thereby, drain electrode 20 is electrically connected with n$^+$ substrate 11.

A pad electrode 65 is formed to contact source electrodes 16 and cover an interlayer insulating film 71. Pad electrode 65 is made of, for example, aluminum. A protective film 70 is formed in contact with pad electrode 65 and insulating film portion 15b. Further, drain electrode 20 is arranged in contact with n$^+$ substrate 11. Drain electrode 20 is made of, for example, nickel. In addition, a back surface protecting electrode 50 made of, for example, titanium, nickel, silver, or an alloy thereof is arranged in contact with drain electrode 20.

It is noted that the distance from an end portion of JTE region 2 on an inner peripheral side to an end portion of outermost guard ring portion 3c on an outer peripheral side is, for example, not less than about 20 μm and not more than about 200 μm, and preferably not less than about 39 μm and not more than about 200 μm. Further, the distance from the end portion of JTE region 2 on the inner peripheral side to the end portion of outermost guard ring portion 3c on the outer peripheral side is preferably double or more thickness T of drift region 12.

A configuration of a first modification of the MOSFET in the present embodiment will be described with reference to FIG. 3.

Figure 3:
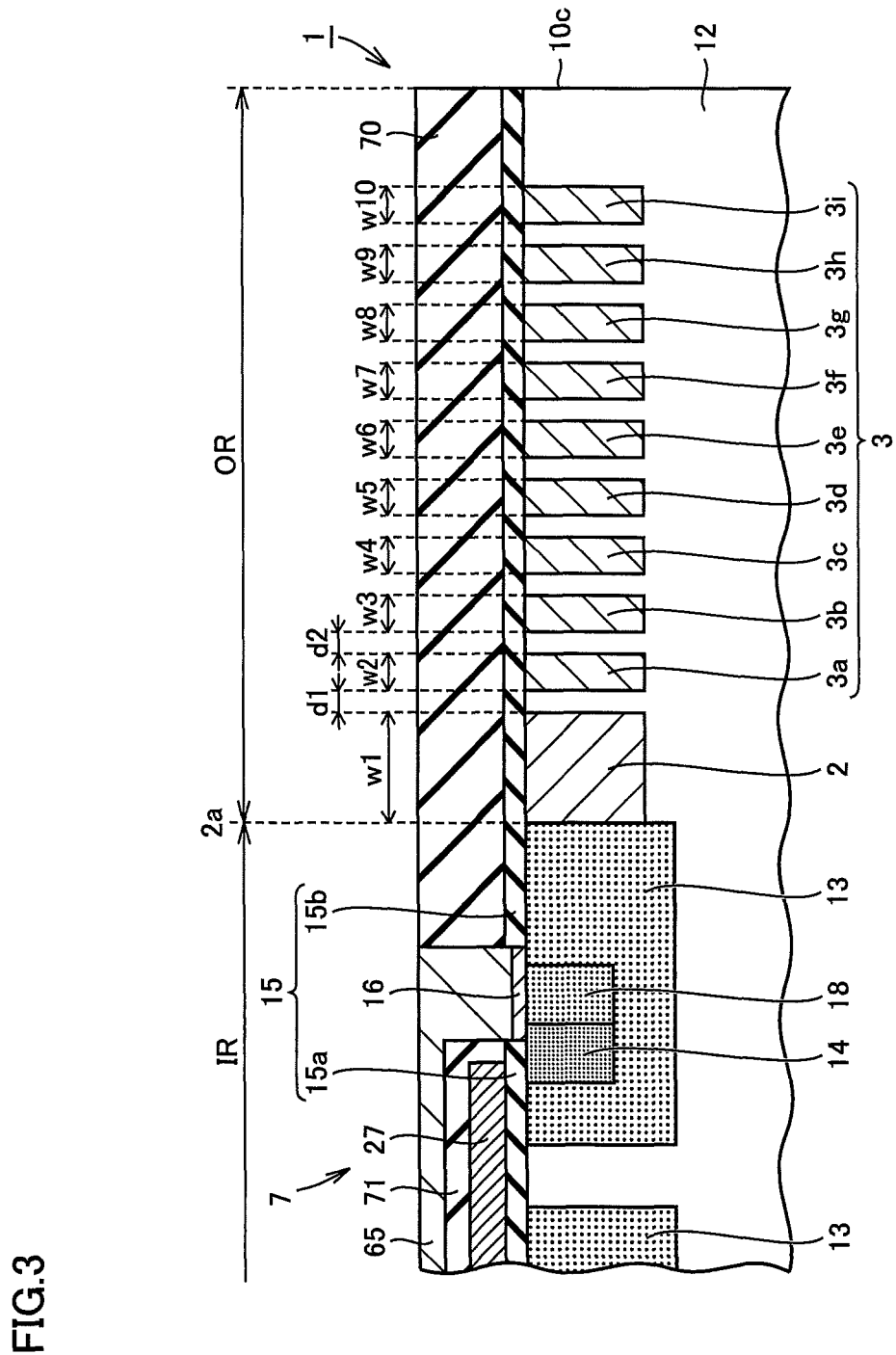
FIG. 3 is a schematic cross sectional view schematically showing a structure of a first modification of the MOSFET in accordance with Embodiment 1 of the present invention.

As shown in FIG. 3, semiconductor element portion 7 provided in element region IR of silicon carbide substrate 10 of MOSFET 1 in accordance with the first modification includes well region 13, and first electric field relaxing region 2 is arranged in contact with well region 13. Well region 13 includes p$^+$ region 18 in contact with source electrode 16, and source region 14 in contact with gate insulating film portion 15a and source electrode 16. The structure of semiconductor element portion 7 in the first modification may be the same as the structure of semiconductor element portion 7 described in FIG. 1.

Second electric field relaxing region 3 is provided on the outer peripheral side of first electric field relaxing region 2, and second electric field relaxing region 3 includes nine guard ring portions 3a to 3i spaced from one another. Second electric field relaxing region 3 may include the plurality of guard ring portions 3a to 3i each having the same width. Width W1 of first electric field relaxing region 2 is, for example, 15 μm, and widths W2 to W10 of nine guard ring portions 3a to 3i, respectively, are each, for example, 5 μm. An interval d1 between first electric field relaxing region 2 and second electric field relaxing region 3 is, for example, not less than about 3 μm and not more than about 5 μm, and an interval d2 between adjacent guard ring portions 3a to 3i is, for example, not less than about 3 μm and not more than about 5

A configuration of a second modification of the MOSFET in the present embodiment will be described with reference to FIG. 4.

Figure 4:
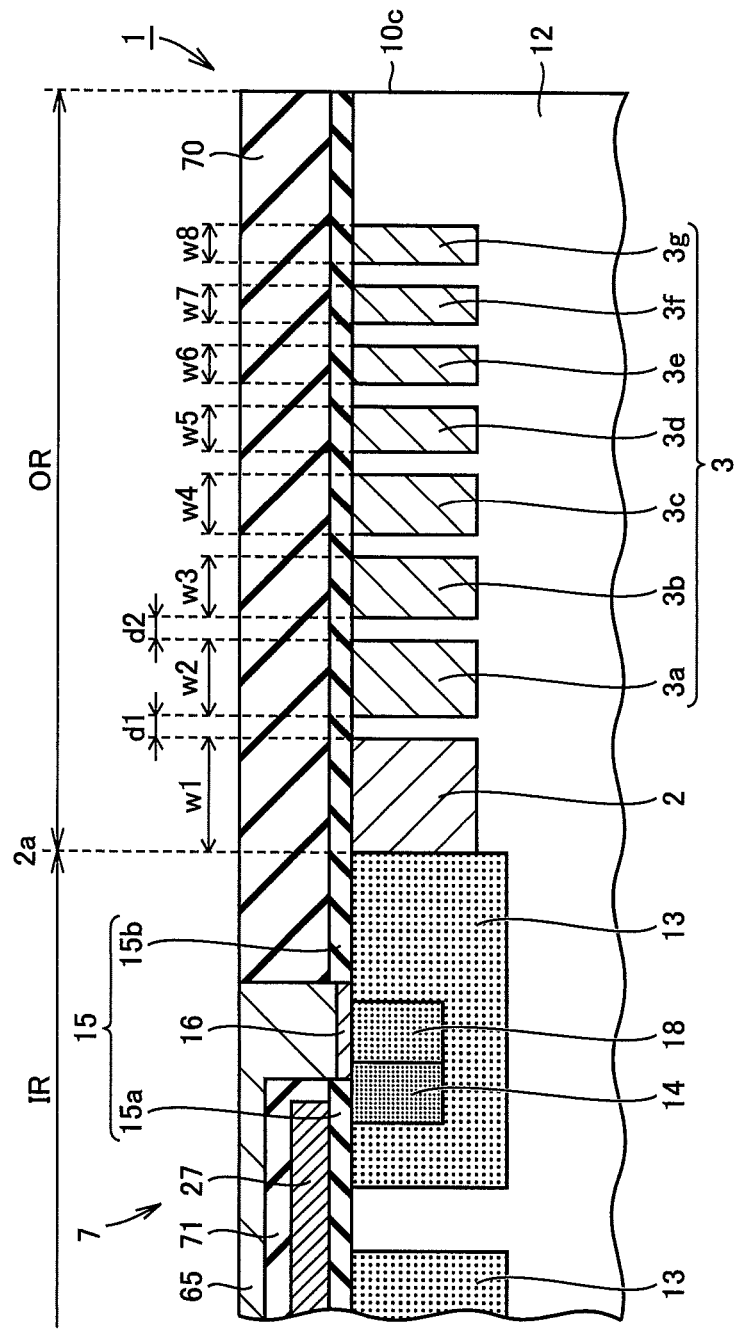
FIG. 4 is a schematic cross sectional view schematically showing a structure of a second modification of the MOSFET in accordance with Embodiment 1 of the present invention.

As shown in FIG. 4, the second electric field relaxing region of the MOSFET in accordance with the second modification is composed of seven guard ring portions 3a to 3g. Preferably, widths W2 to W8 of guard ring portions 3a to 3g, respectively, become smaller from the inner peripheral side toward the outer peripheral side. The widths of guard ring portions 3a to 3g may be decreased monotonically, or may be decreased in a stepwise manner. That is, preferably, of any two guard ring portions among the plurality of guard ring portions, the guard ring portion on the outer peripheral side as viewed in a plan view has a width which is not more than that of the guard ring portion on the inner peripheral side, and the guard ring portion on an outermost peripheral side has a width which is smaller than that of the guard ring portion on an innermost peripheral side.

Width W1 of first electric field relaxing region 2 in the second modification is, for example, 15 μm. When the width of guard ring portion 3a on the innermost peripheral side is defined as width W2 and the width of guard ring portion 3g on the outermost peripheral side is defined as width W8, the guard ring portions from guard ring portion 3a on the innermost peripheral side to guard ring portion 3g on the outermost peripheral side have the following widths: width W2=10 μm, width W3=8 μm, width W4=8 μm, width W5=6 μm, width W6=5 μm, width W7=5 μm, and width W8=5 μm. It is noted that interval d1 between first electric field relaxing region 2 and second electric field relaxing region 3 is, for example, not less than about 3 μm and not more than about 5 μm, and interval d2 between adjacent guard ring portions 3a to 3g is, for example, not less than about 3 μm and not more than about 5 μm.

Next, an operation of MOSFET 1 will be described. When a voltage which is not more than a threshold value is applied to gate electrode 27, i.e., in an OFF state, a portion between well region 13 and drift region 12 located immediately below gate insulating film portion 15a is reverse-biased, and thus they are in a non-conductive state. On the other hand, when a positive voltage is applied to gate electrode 27, an inversion layer is formed in channel region CH in well region 13 near a portion thereof in contact with gate insulating film portion 15a. As a result, source region 14 and drift region 12 are electrically connected to each other, and a current flows between source electrode 16 and drain electrode 20.

Next, a method for manufacturing MOSFET 1 in accordance with the present embodiment will be described.

Figure 5:
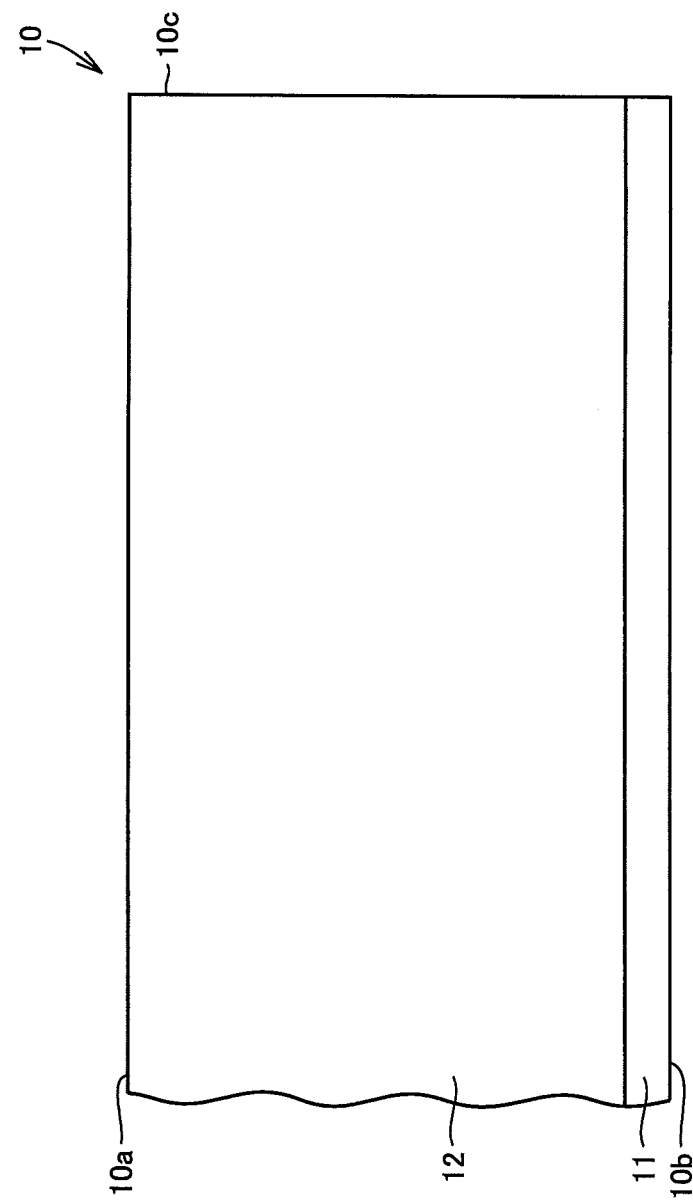
FIG. 5 is a schematic cross sectional view schematically showing a first step of a method for manufacturing the MOSFET in accordance with Embodiment 1 of the present invention.

Referring to FIG. 5, firstly, silicon carbide substrate 10 is prepared by a substrate preparation step. Specifically, drift region 12 is formed by epitaxial growth on one main surface of n⁺ substrate 11 made of hexagonal silicon carbide. The epitaxial growth can be performed using, for example, a mixed gas of silane ($Sin_4$) and propane ($C_3H_8$) as a source gas. On this occasion, for example, N (nitrogen) is introduced as an impurity. Thereby, drift region 12 containing the impurity in a concentration lower than that of the impurity contained in n⁺ substrate 11 is formed.

Silicon carbide substrate 10 has first main surface 10a and second main surface 10b opposite to each other. First main surface 10a of silicon carbide substrate 10 is, for example, a {0001} plane.

Next, on first main surface 10a of silicon carbide substrate 10, an oxide film made of silicon dioxide is formed by, for example, CVD. Then, a resist is applied on the oxide film, and thereafter exposure and development are performed to form a resist film having an opening at a region corresponding to a desired shape of well region 13. Using the resist film as a mask, the oxide film is partially removed by, for example, RIE (Reactive Ion Etching), and thereby a mask layer made of the oxide film having an opening pattern is formed on drift region 12.

Figure 6:
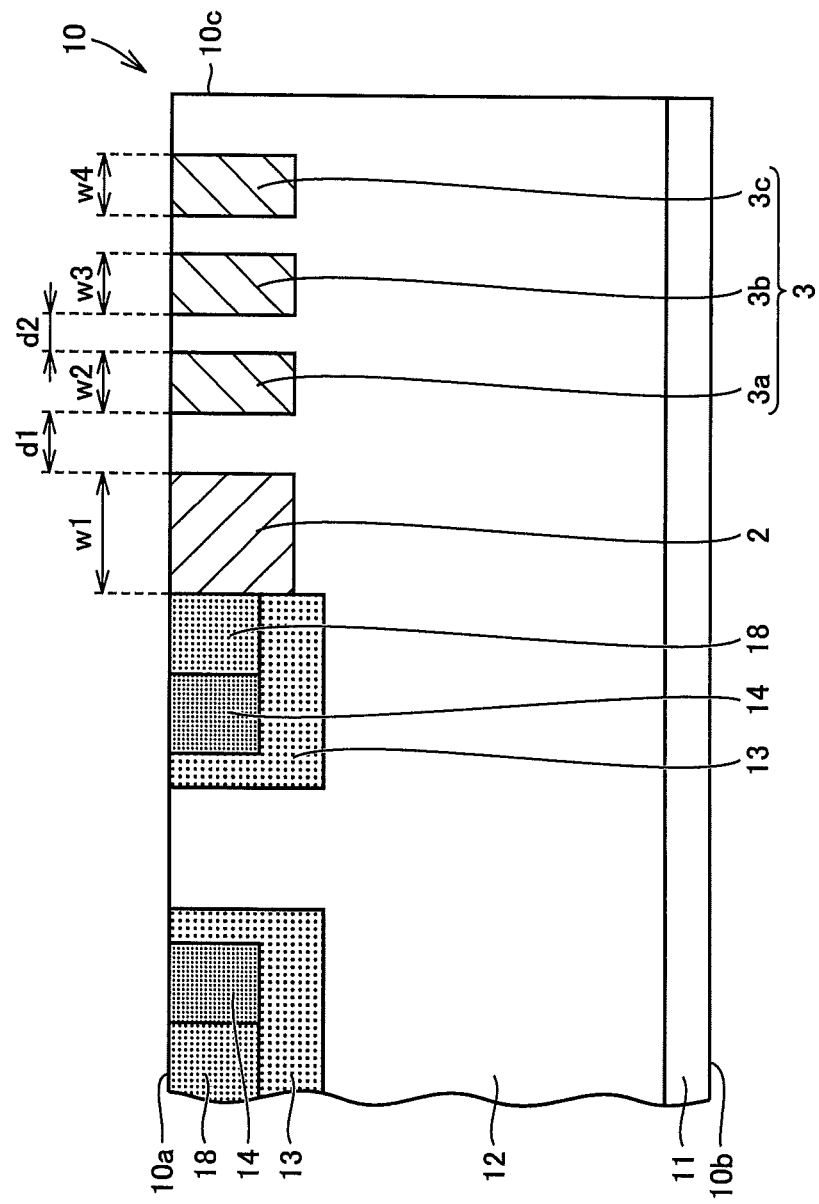
FIG. 6 is a schematic cross sectional view schematically showing a second step of the method for manufacturing the MOSFET in accordance with Embodiment 1 of the present invention.

Next, an ion implantation step is performed. Referring to FIG. 6, in the ion implantation step, by implanting ions into first main surface 10a of silicon carbide substrate 10, well region 13, source region 14, and p⁺ region 18 are formed in element region IR of silicon carbide substrate 10, and JTE region 2 as the first electric field relaxing region and second electric field relaxing region 3 are formed in termination region OR of silicon carbide substrate 10.

Specifically, the above resist film is removed, and, using the mask layer as a mask, ions of an impurity such as Al are implanted into drift region 12 to form well region 13. Further, an n type impurity such as P (phosphorus) is introduced into drift region 12 by ion implantation to form source region 14. Subsequently, an impurity such as Al or B is introduced into drift region 12 by ion implantation to form p⁺ region 18. The ion implantation may be performed with silicon carbide substrate 10 being heated from 300° C. to 500° C.

In addition, ions of an impurity such as Al are implanted into drift region 12 to form JTE region 2 and second electric field relaxing region 3. It is noted that JTE region 2 is formed to contact well region 13. Preferably, the impurity concentration in JTE region 2 is lower than the impurity concentration in well region 13. P⁺ region 18 may be formed in contact with JTE region 2, or may be formed inside well region 13 without contacting JTE region 2.

Next, an activation annealing step is performed. Heat treatment for activating the impurities introduced by the above ion implantation is performed. Specifically, silicon carbide substrate 10 subjected to the ion implantation is heated, for example, at about 1700° C. in an Ar (argon) atmosphere, and held for about 30 minutes.

Figure 7:
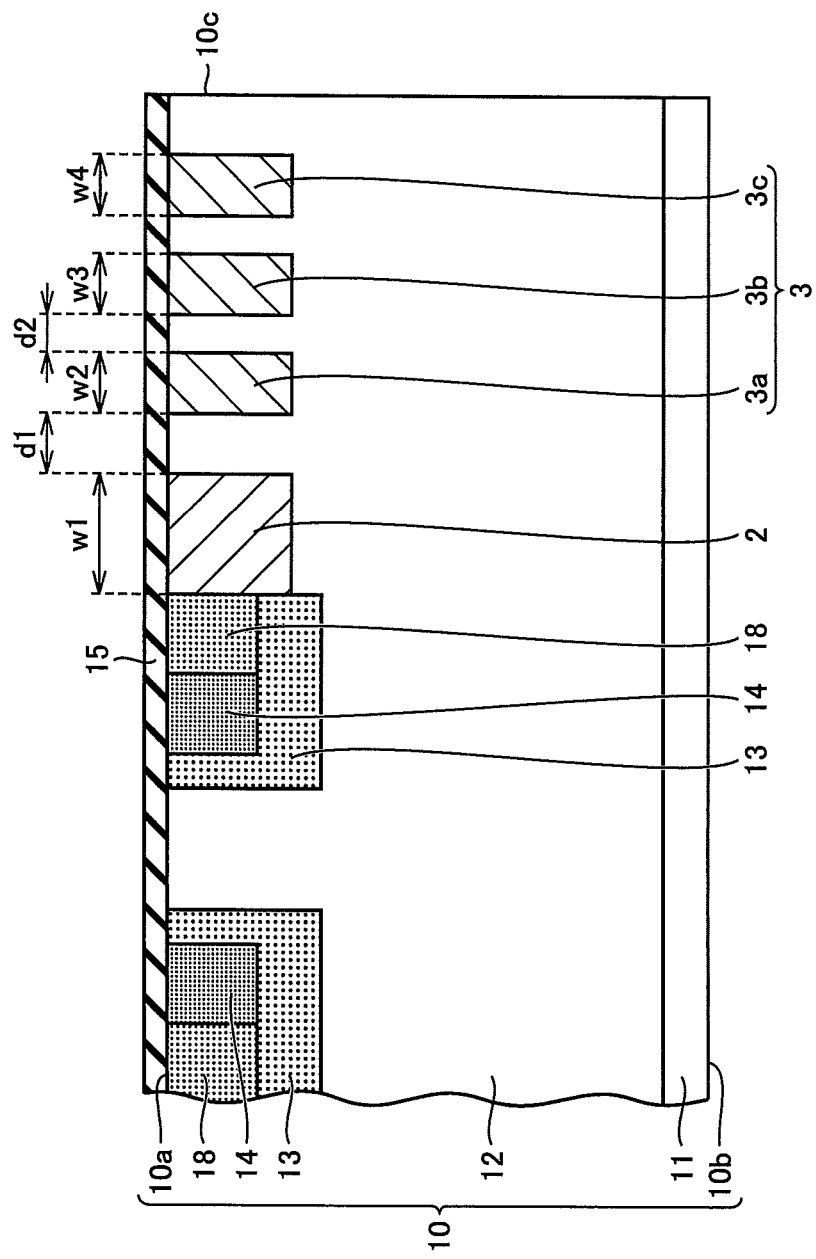
FIG. 7 is a schematic cross sectional view schematically showing a third step of the method for manufacturing the MOSFET in accordance with Embodiment 1 of the present invention.

Next, a thermal oxide film formation step is performed. Specifically, referring to FIG. 7, silicon carbide substrate 10 having the ion-implanted regions formed therein is thermally oxidized. The thermal oxidation can be performed, for example, by heating silicon carbide substrate 10 at about 1300° C. in an oxygen atmosphere, and holding silicon carbide substrate 10 for about 40 minutes. Thereby, insulating film 15 made of silicon dioxide is formed on first main surface 10a of silicon carbide substrate 10. A step of reducing an energy level formed at an interface between $SiO_2$ and SiC by heating silicon carbide substrate 10 from 1100° C. to 1300° C. in an atmosphere containing nitrogen, NO, or $N_2O$ may be performed. Further, heat treatment in an Ar atmosphere may be performed.

Next, a gate electrode formation step is performed. Specifically, referring to FIG. 1, gate electrode 27 made of a conductor such as, for example, polysilicon or aluminum is formed to extend from above one source region 14 to above the other source region 14 and to contact insulating film 15. When polysilicon is used as a material for gate electrode 27, the polysilicon may contain phosphorus in a high concentration more than $1 \times 10^{20}$ cm⁻³. Thereafter, interlayer insulating film 71 made of, for example, silicon dioxide is formed to cover gate electrode 27.

Next, an electrode formation step is performed. Specifically, referring to FIG. 1, source electrode 16 made of, for example, a material containing nickel and silicon is formed in contact with source region 14 and p⁺ region 18. Source electrode 16 may be made of a material containing titanium, aluminum, and silicon. Similarly, drain electrode 20 in contact with second main surface 10b of silicon carbide substrate 10 is formed. The material for forming drain electrode 20 may be a material containing nickel and silicon, or a material containing titanium, aluminum, and silicon. Thereafter, by heating silicon carbide substrate 10 having source electrode 16 formed therein at about 1000° C., source electrode 16 in ohmic contact with source region 14 and p⁺ region 18 of silicon carbide substrate 10 is formed. Pad electrode 65 which contacts source electrode 16 and is made of, for example, aluminum is formed. Further, back surface protecting electrode 50 containing, for example, titanium, nickel, and silver is formed. Thus, MOSFET 1 shown in FIG. 1 is completed.

Although the present embodiment has described a planar type MOSFET as MOSFET 1, MOSFET 1 may be a trench type MOSFET.

Next, the function and effect of MOSFET 1 in accordance with the present embodiment will be described.

According to the MOSFET in accordance with the present embodiment, the ratio calculated by dividing width W1 of JTE region 2 by thickness T of drift region 12 is not less than 0.5 and not more than 1.83. Thereby, electric field strengths at both of a boundary region between well region 13 and JTE region 2 (position B) and a corner portion of second electric field relaxing region 3 on the outer peripheral side (position D) can be decreased. As a result, a MOSFET capable of improving a breakdown voltage without narrowing an element region too much can be obtained.

Further, according to the MOSFET in accordance with the present embodiment, second electric field relaxing region 3 includes a plurality of guard ring portions. Thereby, the electric field strength in termination region OR can be further decreased.

Further, according to the MOSFET in accordance with the present embodiment, each of the plurality of guard ring portions has a width smaller than width W1 of JTE region 2. Thereby, the electric field strength in termination region OR can be further decreased. Furthermore, each of the plurality of guard ring portions has a width of not less than 3 μm. Thereby, the guard ring portions can be manufactured easily.

Further, according to the MOSFET in accordance with the present embodiment, in a case where any two guard ring portions are selected from among the plurality of guard ring portions, the guard ring portion arranged on the outer peripheral side as viewed in a plan view has a width which is not more than that of the guard ring portion arranged on the inner peripheral side, and the guard ring portion arranged on the outermost peripheral side has a width which is smaller than that of the guard ring portion arranged on the innermost peripheral side. Thereby, changes in electric field contour lines in a direction from the center of silicon carbide substrate 10 toward end portion 10c thereof become moderate. As a result, breakdown voltage life (reliability) when a voltage is repeatedly applied can be improved.

Further, according to the MOSFET in accordance with the present embodiment, the number of the plurality of guard ring portions is not less than 6 and not more than 15. Thereby, the electric field strength in termination region OR can be decreased efficiently particularly in a case where a drain voltage is 2.2 kV.

Further, according to the MOSFET in accordance with the present embodiment, the number of the plurality of guard ring portions is not less than 12 and not more than 15. Thereby, the electric field strength in termination region OR can be decreased efficiently particularly in a case where the drain voltage is 3.3 kV.

Further, according to the silicon carbide semiconductor device in accordance with the present embodiment, the silicon carbide semiconductor device is a MOSFET. Thereby, a MOSFET capable of improving a breakdown voltage without narrowing an element region too much can be obtained.

(Embodiment 2)

Next, a configuration of an IGBT as a silicon carbide semiconductor device in accordance with Embodiment 2 of the present invention will be described.

Figure 8:
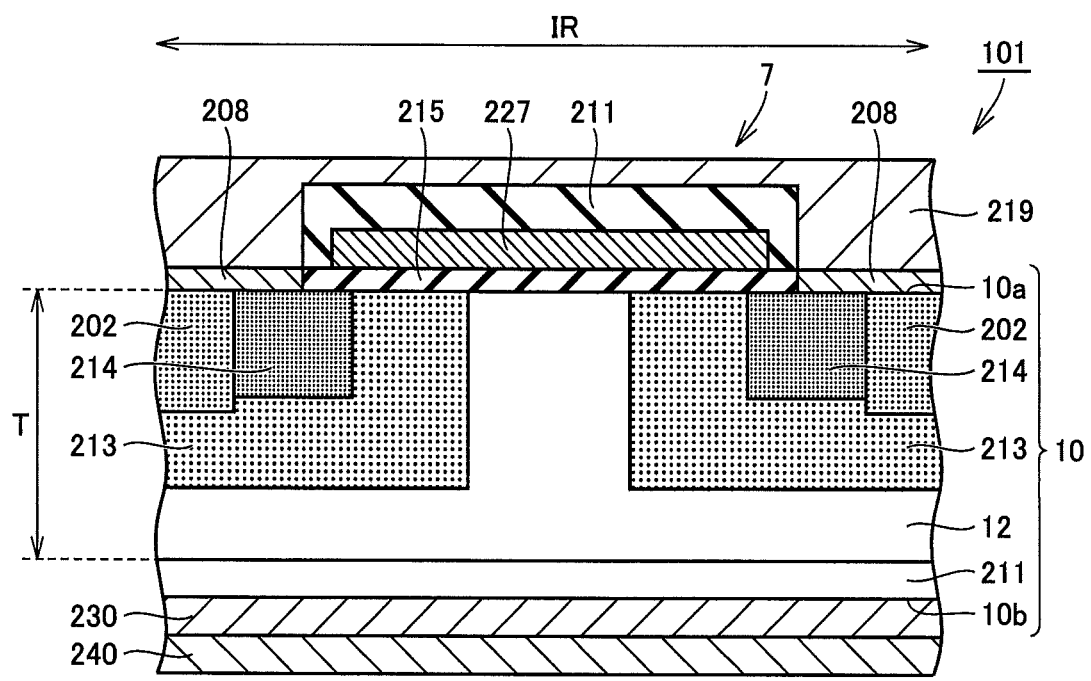
FIG. 8 is a schematic cross sectional view schematically showing a structure of an element portion of an IGBT in accordance with Embodiment 2 of the present invention.

Referring to FIGS. 2 and 8, silicon carbide substrate 10 of an IGBT 101 is composed of element region IR (active region) and termination region OR (invalid region) surrounding element region IR as viewed in a plan view. Termination region OR includes first electric field relaxing region 2 and second electric field relaxing region 3. Element region IR is provided with an IGBT portion as semiconductor element portion 7. Semiconductor element portion 7 includes drift region 12 having n type (the first conductivity type). It is noted that the structure of termination region OR of IGBT 101 in accordance with the present embodiment is the same as the structure of termination region OR of MOSFET 1 described in Embodiment 1.

Referring to FIG. 8, IGBT 101 in the present embodiment mainly has silicon carbide substrate 10, a gate insulating film 215, a gate electrode 227, an interlayer insulating film 221, an emitter contact electrode 208, an emitter wire 219, a collector electrode 230, and a collector wire 240.

Silicon carbide substrate 10 has first main surface 10a and second main surface 10b opposite to each other. Semiconductor element portion 7 provided in element region IR of silicon carbide substrate 10 includes a collector layer 211, a drift region 212, a well region 213, an emitter region 214, and a p$^+$ region 202. Collector layer 211 is a p type region (a second p type region) arranged in contact with second main surface 10b of silicon carbide substrate 10. Each of collector layer 211, drift region 212, well region 213, emitter region 214, and p$^+$ region 202 is made of hexagonal silicon carbide, and its crystal structure preferably has polytype 4H. Each of collector layer 211, well region 213, and p$^+$ region 202 has p type, and each of drift region 212 and emitter region 214 has n type. The impurity concentration in emitter region 214 is higher than the impurity concentration in drift region 212. The impurity concentration in p$^+$ region 202 is higher than the impurity concentration in well region 213. A acceptor impurity for imparting p type is, for example, aluminum (Al) or boron (B). A donor impurity for imparting n type is, for example, nitrogen (N) or phosphorus (P).

The acceptor-type impurity in collector layer 211 has been introduced during epitaxial growth of collector layer 211. The concentration of the acceptor impurity is preferably not less than $1\times10^{17}$ cm$^{-3}$ and not more than $1\times10^{21}$ cm$^{-3}$, and more preferably not less than $1\times10^{19}$ cm$^{-3}$ and not more than $1\times10^{20}$ cm$^{-3}$. The thickness of collector layer 211 is preferably not less than 5 μm.

Drift region 212 is provided on and in contact with collector layer 211. The thickness of drift region 212 is preferably not less than 75 μm. Well region 213 is provided on drift region 212. Emitter region 214 is provided on well region 213 to be separated from drift region 212 by well region 213. P$^+$ region 202 is provided in contact with emitter region 214 and well region 213.

Gate insulating film 215 is provided on well regions 213 to connect drift region 212 with emitter regions 214. A surface of well region 213 facing gate insulating film 215 (i.e., first main surface 10a of silicon carbide substrate 10) is preferably a {0001} plane. Gate insulating film 215 is, for example, a silicon dioxide film. Gate electrode 227 is provided on gate insulating film 215. Gate electrode 227 is made of a conductor such as, for example, polysilicon doped with an impurity, or aluminum (Al).

Emitter contact electrode 208 is an electrode in ohmic contact with each of emitter region 214 and p$^+$ region 202, and is preferably made of silicide, for example, nickel silicide. Emitter contact electrode 208 may be made of a material containing titanium, aluminum, and silicon.

Emitter wire 219 is provided on each of emitter contact electrode 208 and interlayer insulating film 221. Interlayer insulating film 221 is provided to electrically insulate gate electrode 227 from emitter wire 219. Interlayer insulating film 221 is, for example, a silicon dioxide film.

Collector electrode 230 is provided on second main surface 10b in contact with collector layer 211. Collector electrode 230 is an electrode in ohmic contact with collector layer 211, and is preferably made of silicide, for example, nickel silicide. Collector electrode 230 may be made of the same material as that for emitter contact electrode 208.

It is noted that a method for manufacturing IGBT 101 in accordance with the present embodiment is the same as the method for manufacturing MOSFET 1 described in Embodiment 1.

According to the silicon carbide semiconductor device in accordance with the present embodiment, the silicon carbide semiconductor device is an IGBT. Thereby, an IGBT capable of improving a breakdown voltage without narrowing an element region too much can be obtained.

(Embodiment 3)

Next, a structure of an SBD 100 as a silicon carbide semiconductor device in accordance with Embodiment 3 of the present invention will be described.

Figure 9:
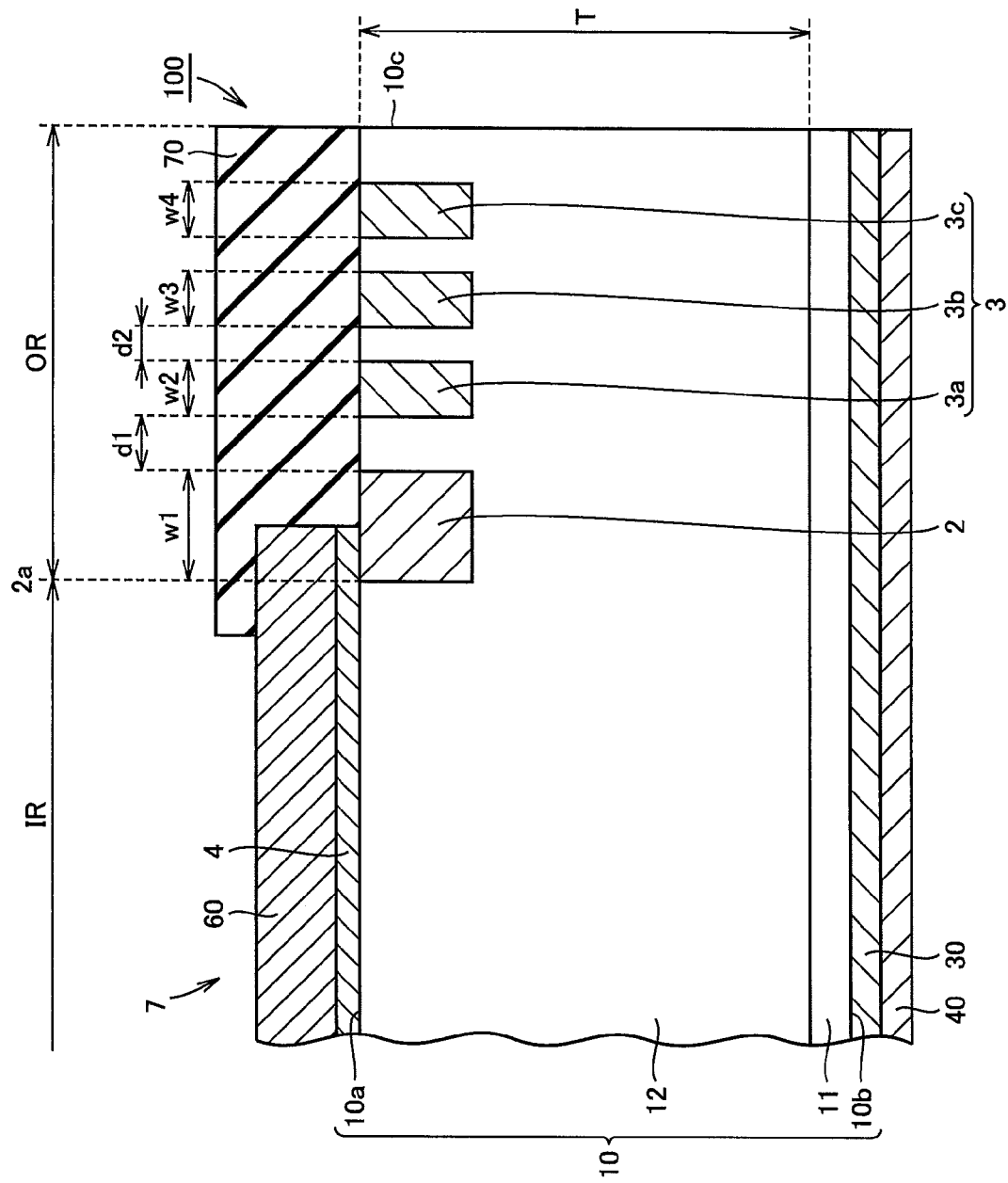
FIG. 9 is a schematic cross sectional view schematically showing a structure of an SBD in accordance with Embodiment 3 of the present invention.

Referring to FIGS. 2 and 9, silicon carbide substrate 10 of SBD 100 is composed of element region IR (active region) and termination region OR (invalid region) surrounding element region IR as viewed in a plan view. Termination region OR includes first electric field relaxing region 2 and second electric field relaxing region 3. Element region IR is provided with an SBD portion as semiconductor element portion 7. Semiconductor element portion 7 includes drift region 12 having n type (the first conductivity type). It is noted that the structure of termination region OR in the present embodiment is the same as the structure of the termination region in Embodiment 1.

As shown in FIG. 9, SBD 100 in the present embodiment mainly has silicon carbide substrate 10, a schottky electrode 4, a pad electrode 60, an ohmic electrode 30, and protective film 70. Silicon carbide substrate 10 is made of, for example, hexagonal silicon carbide of polytype 4H, and has n type. Silicon carbide substrate 10 has first main surface 10a and second main surface 10b opposite to each other.

Silicon carbide substrate 10 mainly includes n+ substrate 11, drift region 12, first electric field relaxing region 2, and second electric field relaxing region 3. N+ substrate 11 is a substrate made of monocrystalline silicon carbide containing an impurity such as, for example, nitrogen (N). The concentration of the impurity contained in n+ substrate 11 is, for example, about $5\times10^{18}$ cm$^{-3}$.

Drift region 12 is a silicon carbide epitaxial layer formed on the n+ substrate. Drift region 12 contains an impurity such as, for example, nitrogen, and the concentration of the impurity is, for example, $1\times10^{16}$ cm$^{-3}$. The impurity concentration in drift region 12 is lower than the impurity concentration in n+ substrate 11. Thickness T of drift region 12 is, for example, not less than 15 μm and not more than 40 μm.

First electric field relaxing region 2 is, for example, a JTE region, and second electric field relaxing region 3 is, for example, a guard ring region. First electric field relaxing region 2 and second electric field relaxing region 3 are p type regions into which ions of an impurity such as, for example, aluminum (Al) or boron (B) are implanted. Further, silicon carbide substrate 10 may have a field stop region (not shown) surrounding JTE region 2 as viewed from the direction of the normal to first main surface 10a. The field stop region is an n+ type region into which ions of, for example, phosphorus (P) are implanted. The impurity concentration in the field stop region is higher than the impurity concentration in drift region 12.

Schottky electrode 4 is provided on first main surface 10a of silicon carbide substrate 10, and is in contact with drift region 12, first electric field relaxing region 2, and protective film 70. Schottky electrode 4 is made of, for example, a material such as titanium (Ti), nickel (Ni), titanium nitride (TiN), gold (Au), molybdenum (Mo), and tungsten (W), and an alloy thereof. Schottky electrode 4 is in schottky contact with drift region 12.

Pad electrode 60 is formed in contact with schottky electrode 4. Pad electrode 60 is made of, for example, aluminum. Protective film 70 is formed in contact with pad electrode 60, schottky electrode 4, and first main surface 10a of silicon carbide substrate 10.

Protective film 70 is made of, for example, silicon dioxide, and is in contact with first electric field relaxing region 2 and second electric field relaxing region 3. Protective film 70 is arranged to contact schottky electrode 4 and pad electrode 60, and to contact first main surface 10a to extend from schottky electrode 4 to end portion 10c of silicon carbide substrate 10. First electric field relaxing region 2 is in contact with protective film 70 and schottky electrode 4. An end portion of first electric field relaxing region 2 on the inner peripheral side is at boundary line 2a between element region IR and termination region OR of silicon carbide substrate 10.

Ohmic electrode 30 is arranged in contact with n+ substrate 11. Ohmic electrode 30 is made of, for example, nickel. In addition, a back surface protecting electrode 40 made of, for example, titanium, nickel, silver, or an alloy thereof is arranged in contact with ohmic electrode 30.

Next, a method for manufacturing SBD 100 as a silicon carbide diode in accordance with the embodiment of the present invention will be described.

Firstly, the substrate preparation step is performed. Specifically, an ingot made of, for example, hexagonal silicon carbide of polytype 4H (not shown) is sliced to prepare n+ substrate 11 having n type conductivity. The n+ substrate contains an impurity such as, for example, nitrogen (N). The concentration of the impurity contained in the n+ substrate is, for example, about $5\times10^{18}$ cm$^{-3}$.

Next, drift region 12 is formed on n+ substrate 11 by epitaxial growth. Drift region 12 is a silicon carbide layer having n type conductivity. The concentration of an impurity such as nitrogen contained in drift region 12 is, for example, about $7\times10^{15}$ cm$^{-3}$.

Figure 10:
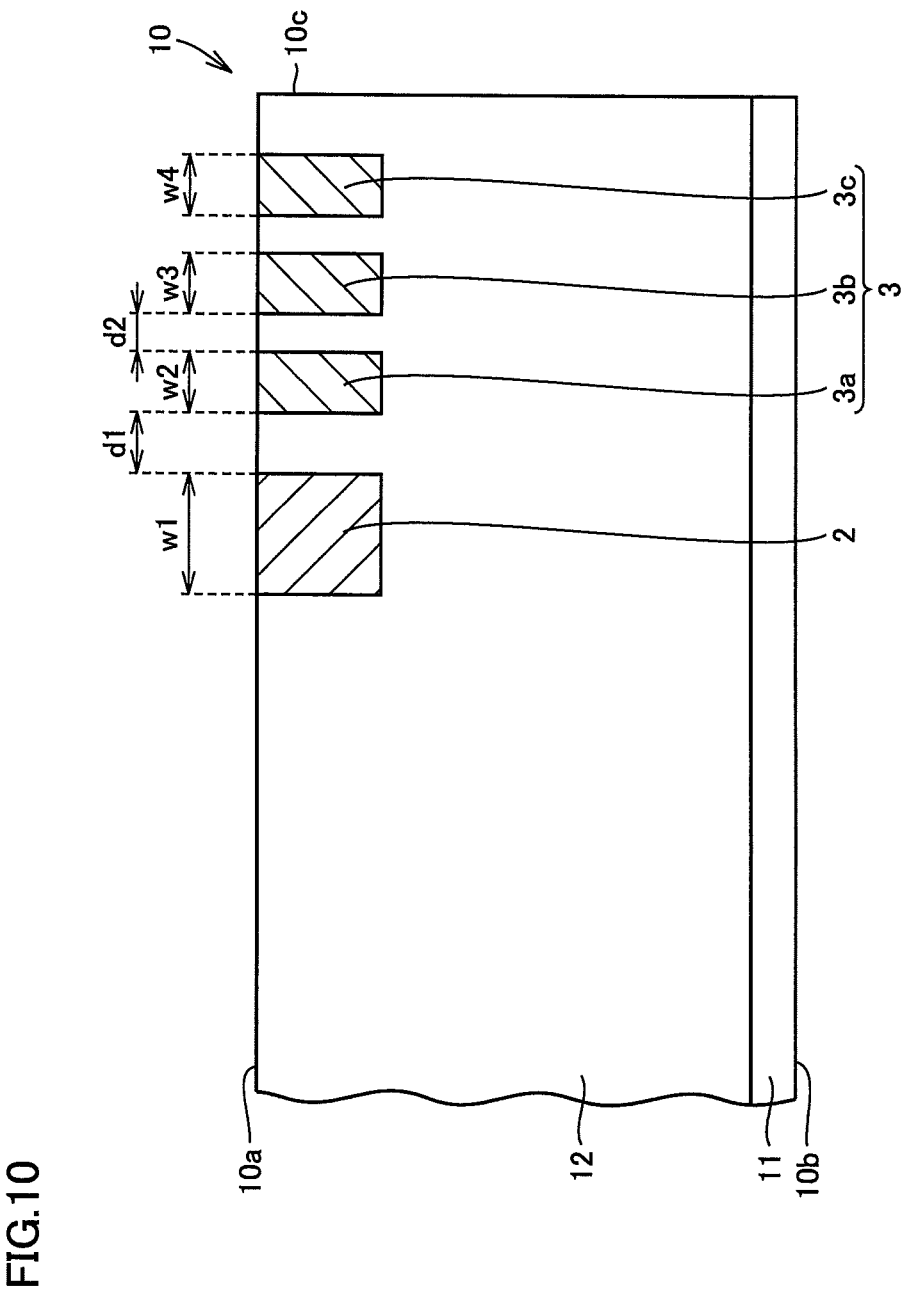
FIG. 10 is a schematic cross sectional view schematically showing a first step of a method for manufacturing the SBD in accordance with Embodiment 3 of the present invention.

Next, the ion implantation step is performed. Referring to FIG. 10, for example, Al (aluminum) ions are implanted into drift region 12 of silicon carbide substrate 10 to form first electric field relaxing region 2 and second electric field relaxing region 3 having p type conductivity. Thus, silicon carbide substrate 10 including n+ substrate 11, drift region 12, first electric field relaxing region 2, and second electric field relaxing region 3, and having first main surface 10a and second main surface 10b opposite to each other is prepared.

Next, the activation annealing step is performed. Specifically, silicon carbide substrate 10 is heated, for example, at a temperature of about 1800° C. in an atmosphere of an inert gas such as argon, and thereby silicon carbide substrate 10 including first electric field relaxing region 2 and second electric field relaxing region 3 is annealed, and the impurity introduced in the above ion implantation step is activated. Thereby, a desired carrier is produced in the regions into which the impurity is introduced.

Next, the electrode formation step is performed. Specifically, referring to FIG. 11, schottky electrode 4 containing, for example, titanium (Ti), nickel (Ni), molybdenum (Mo), tungsten (W), titanium nitride (TiN), or the like is subsequently formed in contact with first electric field relaxing region 2 and second electric field relaxing region 3 of silicon carbide substrate 10. After schottky electrode 4 is formed, silicon carbide substrate 10 is heated at not less than about 300° C. and not more than about 500° C. Thereby, the schottky barrier height of schottky electrode 4 in contact with silicon carbide substrate 10 is controlled, and a contact interface having an enhanced high-temperature stability is formed.

Next, an ohmic electrode formation step is performed. Specifically, second main surface 10b of silicon carbide substrate 10 is ground, and ohmic electrode 30 made of, for example, nickel is formed in contact with second main surface 10b. Thereafter, back surface protecting electrode 40 made of, for example, titanium, nickel, silver, or an alloy thereof is formed in contact with ohmic electrode 30.

Next, a protective film formation step is performed. Specifically, referring to FIG. 9, protective film 70 in contact with pad electrode 60, schottky electrode 4, and first main surface 10a of silicon carbide substrate 10 is formed by, for example, a plasma CVD (Chemical Vapor Deposition) method. Protective film 70 is made of, for example, silicon dioxide (SiO$_2$), silicon carbide (SiN), polyimide, or laminated films thereof. Thereby, SBD 100 as the silicon carbide diode shown in FIG. 9 is completed.

According to the silicon carbide semiconductor device in accordance with the present embodiment, the silicon carbide semiconductor device is an SBD. Thereby, an SBD capable of improving a breakdown voltage without narrowing an element region too much can be obtained.

(Embodiment 4)

Next, a structure of an MPS as a silicon carbide semiconductor device in accordance with Embodiment 4 of the present invention will be described.

Figure 12:
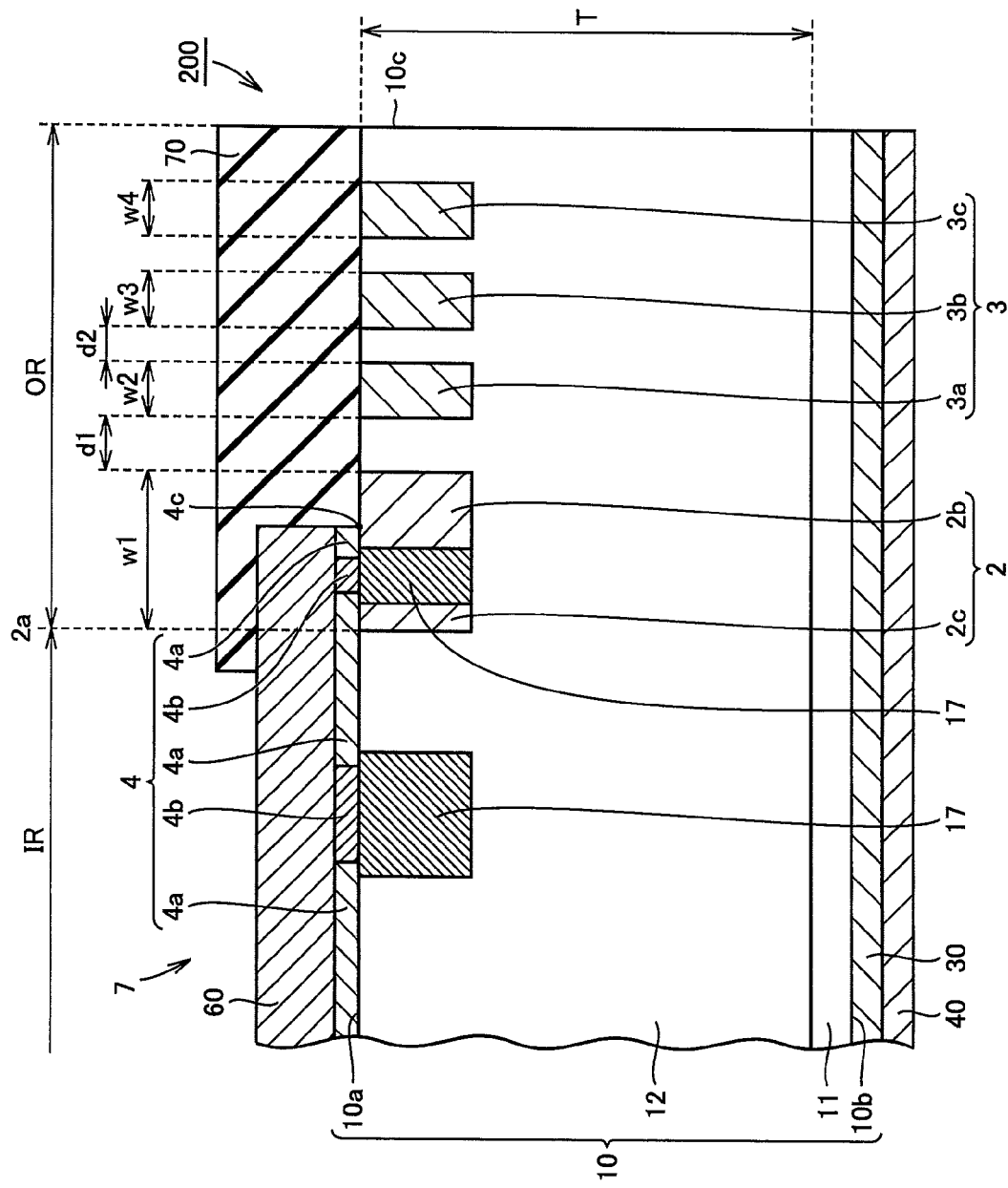
FIG. 12 is a schematic cross sectional view schematically showing a structure of an MPS (Merged Pin Schottky Barrier Diode) in accordance with Embodiment 4 of the present invention.

Referring to FIGS. 2 and 12, silicon carbide substrate 10 of an MPS 200 is composed of element region IR (active region) and termination region OR (invalid region) surrounding element region IR as viewed in a plan view. Termination region OR includes first electric field relaxing region 2 and second electric field relaxing region 3. Element region IR is provided with an MPS portion as semiconductor element portion 7. Semiconductor element portion 7 includes drift region 12 having n type (the first conductivity type). It is noted that the structure of termination region OR in the present embodiment is the same as the structure of the termination region in Embodiment 1.

Referring to FIG. 12, MPS 200 in accordance with the present embodiment mainly has silicon carbide substrate 10, electrode 4, pad electrode 60, protective film 70, ohmic electrode 30, and back surface protecting electrode 40.

Silicon carbide substrate 10 includes $n^+$ substrate 11, drift region 12, a p type region 17, first electric field relaxing region 2, and second electric field relaxing region 3. $N^+$ if substrate 11 is a substrate made of monocrystalline silicon carbide containing an impurity such as, for example, nitrogen (N). The concentration of the impurity contained in $n^+$ substrate 11 is, for example, about $5 \times 10^{18}$ $cm^{-3}$.

Drift region 12 is a silicon carbide epitaxial layer formed on $n^+$ substrate 11. Drift region 12 contains an impurity such as, for example, nitrogen, and the concentration of the impurity in drift region 12 is, for example, $1 \times 10^{16}$ $cm^{-3}$. The concentration of an impurity such as aluminum in p type region 17 is, for example, about $1 \times 10^{19}$ $cm^{-3}$. Thickness T of drift region 12 is, for example, not less than about 15 μm and not more than about 40 μm.

Each of first electric field relaxing region 2 and second electric field relaxing region 3 is a p type region into which ions of an impurity such as, for example, aluminum (Al) or boron (B) are implanted. P type region 17 having an impurity concentration higher than that in first electric field relaxing region 2 is formed to penetrate first electric field relaxing region 2. Further, silicon carbide substrate 10 may have a field stop region (not shown) surrounding first electric field relaxing region 2 and second electric field relaxing region 3. The field stop region is an $n^+$ type region into which ions of, for example, phosphorus (P) are implanted, and has an impurity concentration higher than that in drift region 12.

Electrode 4 is provided on first main surface 10a of silicon carbide substrate 10, and is made of, for example, titanium (Ti). Other than titanium, for example, nickel (Ni), titanium nitride (Ti), gold (Au), molybdenum (Mo), tungsten (W) or the like may be used for electrode 4. Electrode 4 may be composed of, for example, a single material. The single material includes a material composed of a simple substance made of the same element, and a material composed of the same compound. Further, even if the material is formed by, for example, sputtering or plating and thereafter a portion of the material is heated and thus a bonding state in the portion of the material is changed, the portion in which the bonding state is changed and a portion in which the bonding state is not changed constitute a single material.

Electrode 4 includes a first region 4a which makes schottky contact with drift region 12, and a second region 4b which makes ohmic contact with p type region 17. As viewed in a cross sectional view (i.e., in the field of view in FIG. 12), a plurality of second regions 4b may be arranged with an interval therebetween. Further, as viewed in a cross sectional view, first regions 4a and second regions 4b may be arranged alternately. P type region 17 is formed to extend from first main surface 10a of silicon carbide substrate 10 toward ohmic electrode 30. First region 4a and second region 4b may be made of a single material, or may be made of different materials. For example, first region 4a and second region 4b are made of the same metal or the same alloy.

Figure 13:
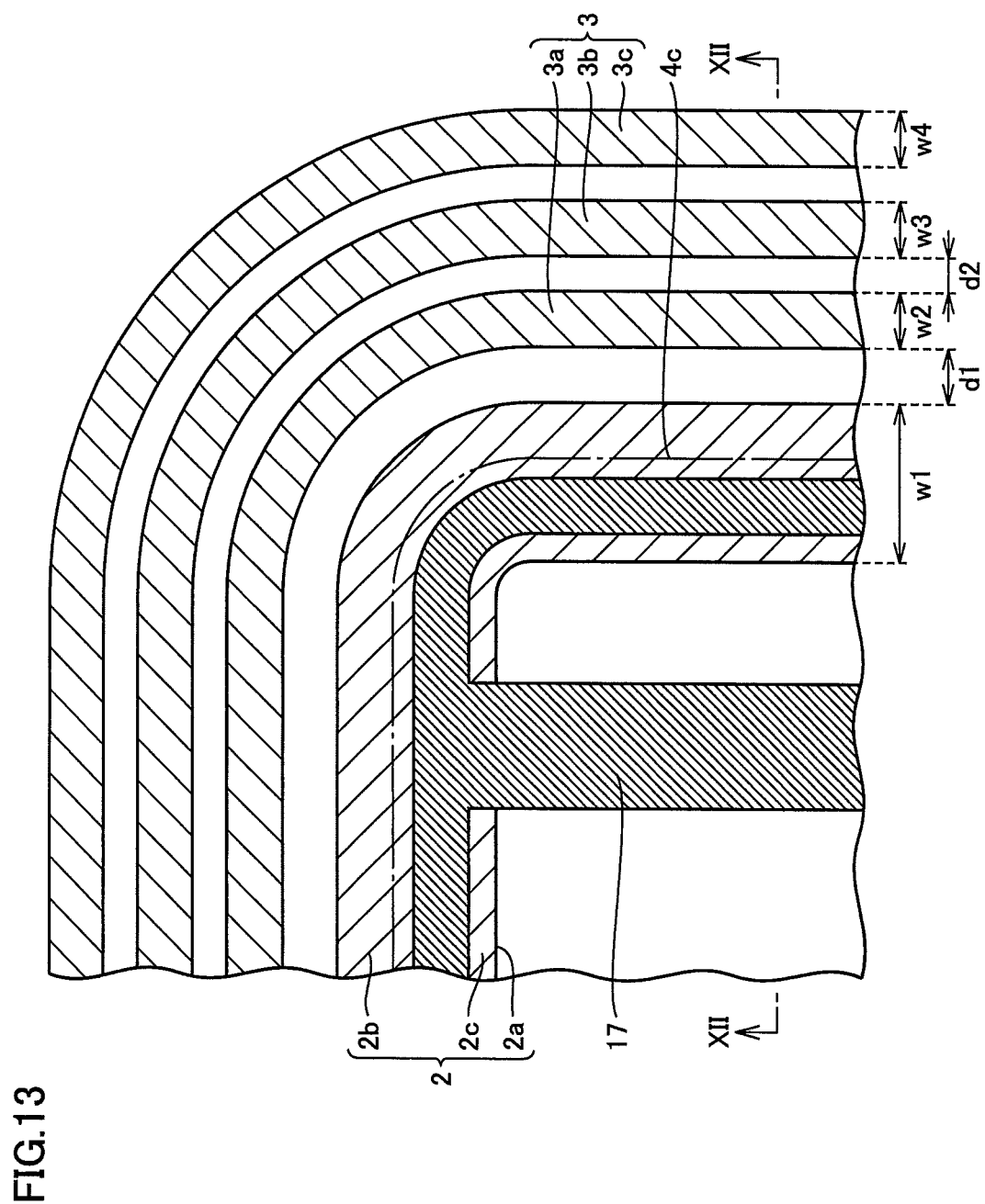
FIG. 13 is a schematic plan view schematically showing the structure of the MPS in accordance with Embodiment 4 of the present invention.

Referring to FIG. 13, as observed from the direction of the normal to silicon carbide substrate 10 (in other words, as viewed in a plan view), electrode 4 has a substantially square shape. First electric field relaxing region 2 has a first p type region 2b formed along an outer periphery 4c of electrode 4, and a second p type region 2c arranged inside outer periphery 4c of electrode 4. Further, p type region 17 is arranged to be surrounded by outer periphery 4c of electrode 4. P type region 17 has, for example, a fence-like shape. P type region 17 may be formed to be sandwiched between first p type region 2b and second p type region 2c. Further, p type region 17 may have a region not in contact with first electric field relaxing region 2.

Referring to FIG. 12 again, pad electrode 60 is formed in contact with first regions 4a and second regions 4b of electrode 4. Pad electrode 60 is made of, for example, aluminum. Protective film 70 made of, for example, silicon dioxide is formed in contact with pad electrode 60, first region 4a, and first main surface 10a of silicon carbide substrate 10. Further, ohmic electrode 30 is arranged in contact with $n^+$ substrate 11. Ohmic electrode 30 is made of, for example, nickel. In addition, back surface protecting electrode 40 made of, for example, titanium, nickel, silver, or an alloy thereof is arranged in contact with ohmic electrode 30. First electric field relaxing region 2 is in contact with protective film 70 and first region 4a of electrode 4. An end portion of first electric field relaxing region 2 on the inner peripheral side is at boundary line 2a between element region IR and termination region OR of silicon carbide substrate 10.

It is noted that MPS 200 is a P/N diode having p type region 17 connected with drift region 12 having n type.

Next, a method for manufacturing MPS 200 as the silicon carbide semiconductor device in accordance with the present embodiment will be described.

Firstly, the substrate preparation step is performed. In the substrate preparation step, an ingot made of, for example, monocrystalline silicon carbide of polytype 4H (not shown) is sliced to prepare $n^+$ substrate 11 having n type conductivity (the first conductivity type). The $n^+$ substrate contains an impurity such as, for example, nitrogen. The concentration of the impurity contained in the $n^+$ substrate is, for example, about $5 \times 10^{18}$ $cm^{-3}$.

Next, drift region 12 having n type conductivity (the first conductivity type) is formed on $n^+$ substrate 11 by epitaxial growth. The impurity concentration in drift region 12 is, for example, $1 \times 10^{16}$ $cm^{-3}$.

Figure 14:
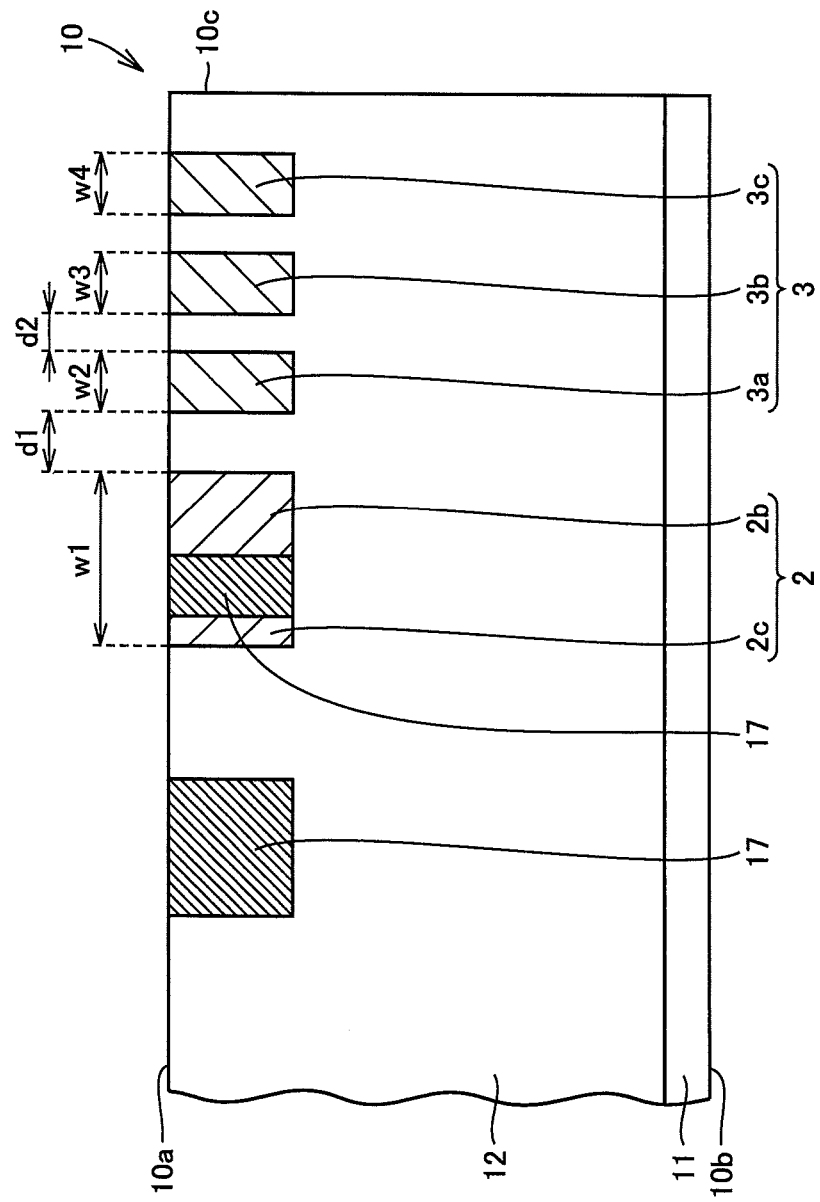
FIG. 14 is a schematic cross sectional view schematically showing a first step of a method for manufacturing the MPS in accordance with Embodiment 4 of the present invention.

Next, the ion implantation step is performed. Referring to FIG. 14, in the ion implantation step, for example, Al (aluminum) ions are implanted into silicon carbide substrate 10 to form first electric field relaxing region 2 and second electric field relaxing region 3 having p type conductivity (the second conductivity type). Similarly, for example, Al (aluminum) ions are implanted into drift region 12 and first electric field relaxing region 2 to form p type region 17 having p type conductivity (the second conductivity type). P type region 17 has a portion in contact with first electric field relaxing region 2 and a portion not in contact with first electric field relaxing region 2 as viewed in a cross sectional view (i.e., in the field of view in a direction parallel to first main surface 10a). The impurity concentration in p type region 17 is, for example, about $1×10^{19}$ cm$^{-3}$. Thus, silicon carbide substrate 10 having p type region 17, first electric field relaxing region 2, and second electric field relaxing region 3 is prepared.

Next, the activation annealing step is performed. In the activation annealing step, silicon carbide substrate 10 is heated, for example, at a temperature of about 1800° C. in an atmosphere of an inert gas such as argon, and thereby p type region 17, first electric field relaxing region 2, and second electric field relaxing region 3 are annealed, and the impurity introduced in the above ion implantation step is activated. Thereby, a desired carrier is produced in the regions into which the impurity is introduced.

Figure 15:
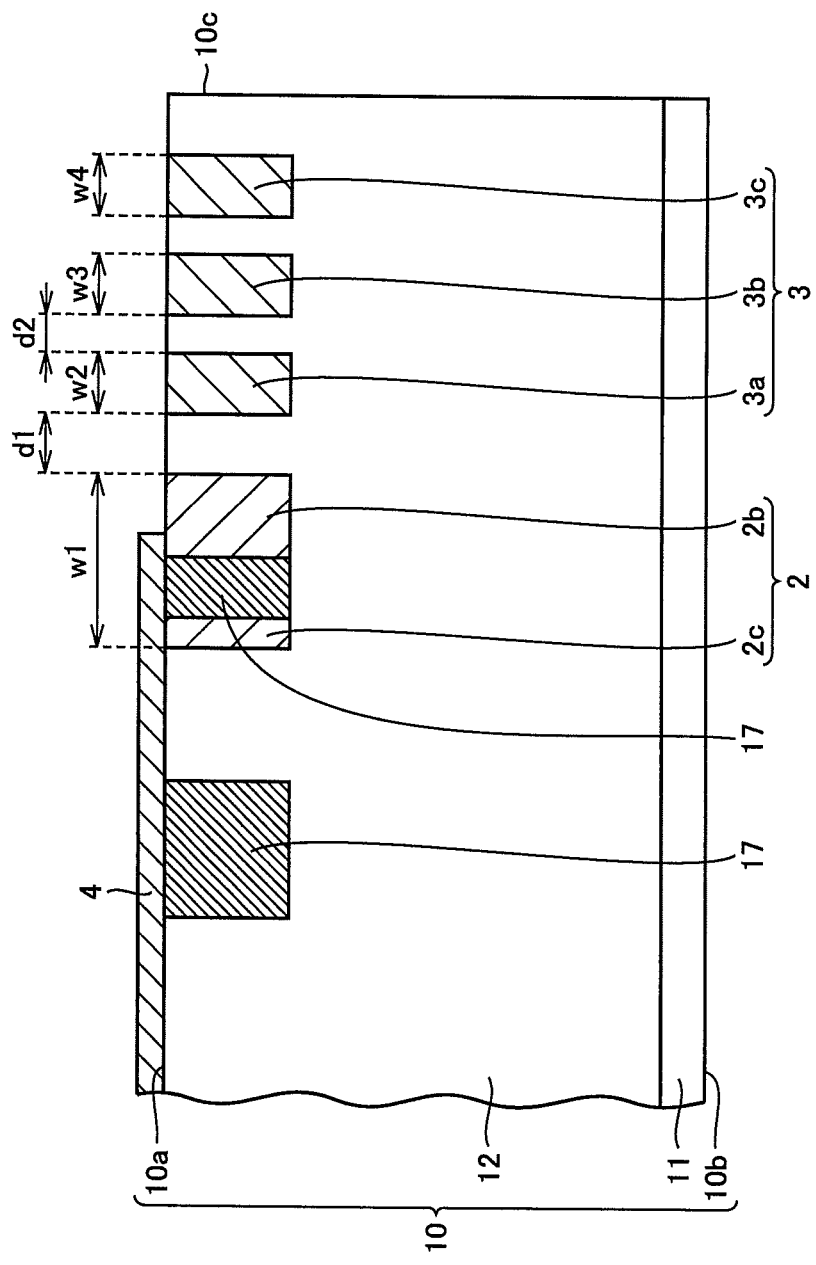
FIG. 15 is a schematic cross sectional view schematically showing a second step of the method for manufacturing the MPS in accordance with Embodiment 4 of the present invention.

Next, the electrode formation step is performed. Referring to FIG. 15, the electrode formation step preferably includes a metal film formation step, a schottky contact step, and an ohmic contact step. For example, in the metal film formation step, electrode 4 made of a single material is formed in contact with drift region 12, p type region 17, and first electric field relaxing region 2 of silicon carbide substrate 10. Electrode 4 is a film of a metal such as, for example, titanium (Ti), nickel (Ni), molybdenum (Mo), tungsten (W), or titanium nitride (TiN). Specifically, electrode 4 is formed on first main surface 10a of silicon carbide substrate 10 in contact with drift region 12, p type region 17, and first electric field relaxing region 2.

Next, the schottky contact step is performed. In the schottky contact step, electrode 4 formed on first main surface 10a of silicon carbide substrate 10 is entirely heated. The entire heating of electrode 4 is performed, for example, using laser annealing. Electrode 4 may be entirely heated in an inert gas atmosphere by placing silicon carbide substrate 10 having electrode 4 formed thereon in a heating furnace. Electrode 4 is heated to, for example, about 500° C. Thereby, the schottky barrier height is controlled, and drift region 12 and first region 4a are brought into schottky contact with each other with an enhanced high-temperature stability. It is noted that drift region 12 and first region 4a may be brought into schottky contact with each other by locally heating first region 4a of electrode 4.

Figure 16:
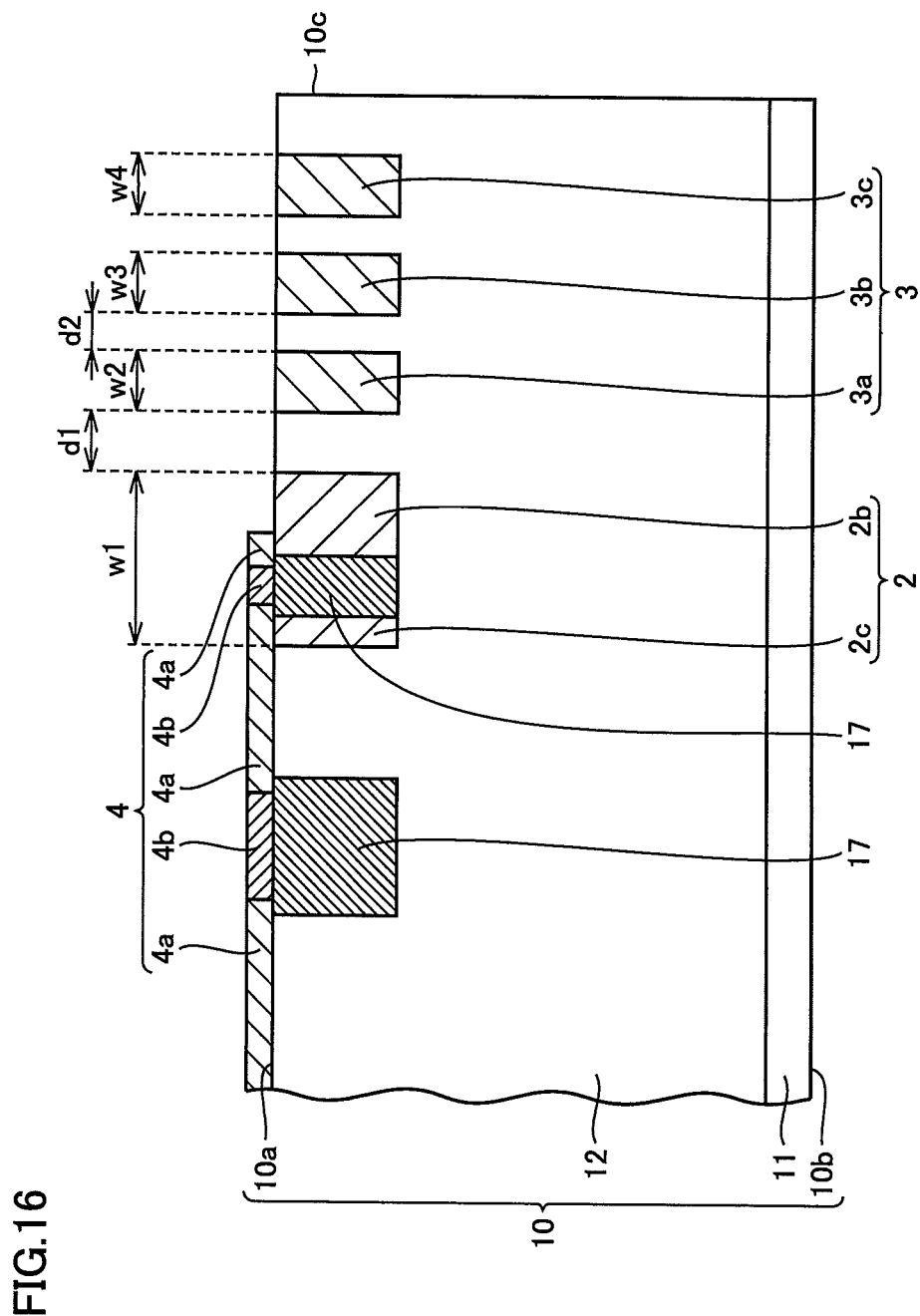
FIG. 16 is a schematic cross sectional view schematically showing a third step of the method for manufacturing the MPS in accordance with Embodiment 4 of the present invention.

Next, the ohmic contact step is performed. In the ohmic contact step, referring to FIG. 16, p type region 17 and second region 4b of electrode 4 are brought into ohmic contact with each other by locally heating second region 4b in contact with p type region 17. The step of bringing p type region 17 and second region 4b into ohmic contact with each other by locally heating second region 4b is preferably performed by subjecting second region 4b to laser annealing. The local heating of second region 4b may be performed using electron beams. Further, second region 4b is heated to, for example, about 1000° C. The heating temperature for electrode 4 in the ohmic contact step is higher than the heating temperature for electrode 4 in the schottky step.

Next, a pad electrode and protective film formation step is performed. Specifically, on and in contact with electrode 4, pad electrode 60 made of, for example, aluminum is formed. Thereafter, protective film 70 is formed in contact with pad electrode 60, second region 4b of electrode 4, and first main surface 10a of silicon carbide substrate 10.

Figure 11:
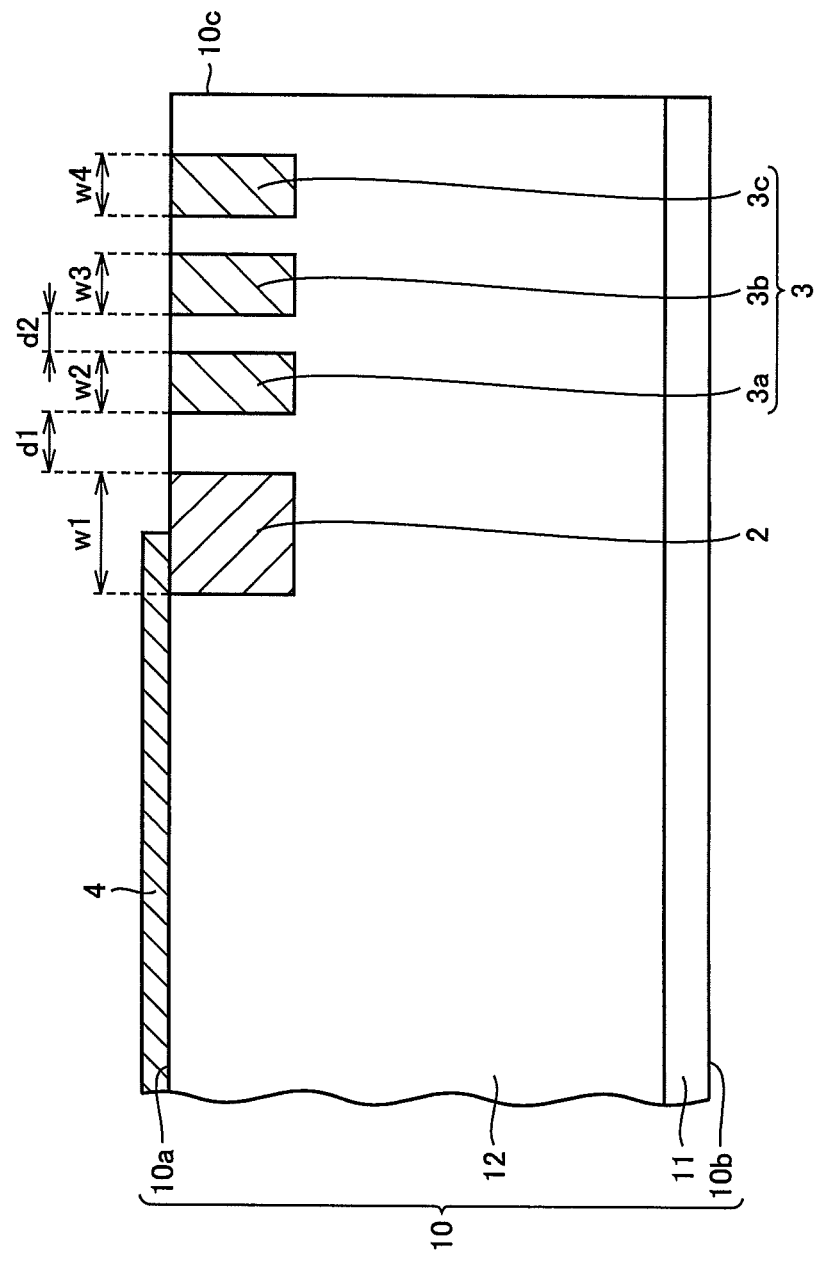
FIG. 11 is a schematic cross sectional view schematically showing a second step of the method for manufacturing the SBD in accordance with Embodiment 3 of the present invention.

Next, the ohmic electrode formation step is performed. Specifically, second main surface 10b opposite to first main surface 10a of silicon carbide substrate 10 is ground, and ohmic electrode 30 in contact with second main surface 10b is formed. Ohmic electrode 30 contains, for example, nickel. Thereafter, back surface protecting electrode 40 made of, for example, titanium, nickel, silver, or an alloy thereof is formed in contact with ohmic electrode 30. Thereby, MPS 200 shown in FIG. 11 is completed.

According to the silicon carbide semiconductor device in accordance with the present embodiment, the silicon carbide semiconductor device is a P/N diode (MPS). Thereby, a P/N diode (MPS) capable of improving a breakdown voltage without narrowing an element region too much can be obtained.

EXAMPLE 1

In the present example, electric field strength obtained when the ratio calculated by dividing width W1 of first electric field relaxing region 2 (JTE region 2) by thickness T of drift region 12 was changed was investigated.

Firstly, six types of MOSFET models having a structure as shown in FIG. 1 in the embodiment and having changed ratios calculated by dividing width W1 of JTE region 2 by thickness T of drift region 12 were prepared. The impurity concentration in drift region 12 was set to $4.5×10^{15}$ cm$^{-3}$. Thickness T of drift region 12 was set to 23 μm. By changing width W1 of JTE region 2 to 7 μm, 15 μm, 23 μm, 31 μm, 39 μm, and 47 μm, the ratios calculated by dividing width W1 of JTE region 2 by thickness T of drift region 12 (expressed in percentage) were set to about 30%, about 65%, 100%, about 135%, about 170%, and about 204%. The impurity concentration in well region 13 was set to $5×10^{16}$ cm$^{-3}$. The thickness of well region 13 was set to 0.9 μm. The dose amount in each of JTE region 2 and the guard ring portions was set to $1.35×10^{13}$ cm$^2$. The thickness of each of JTE region 2 and the guard ring portions was set to 0.7 μm.

The numbers of the guard ring portions when widths W1 of JTE region 2 were set to 7 μm, 15 μm, 23 μm, 31 μm, 39 μm, and 47 μm were set to 10, 9, 8, 7, 6, and 5, respectively. The width of each of the guard ring portions was set to 5 μm. Interval d1 between JTE region 2 and innermost guard ring portion 3a and interval d2 between the adjacent guard ring portions were each set to 5 μm.

Electric field strength distributions in the above six types of MOSFET models were calculated. An electric field strength at a corner portion of well region 13 (position A), an electric field strength at a contact point between well region 13 and a corner portion of JTE region 2 (position B), an electric field strength at a corner portion of JTE region 2 on the outer peripheral side (position C) in termination region OR of the MOSFET, and an electric field strength at a corner portion of the outermost guard ring portion on the outer peripheral side (position D) were calculated, and the electric field strengths at these positions were estimated. The drain voltage used in calculating the electric field strength distributions was set to 2.2 kV.

Figure 17:
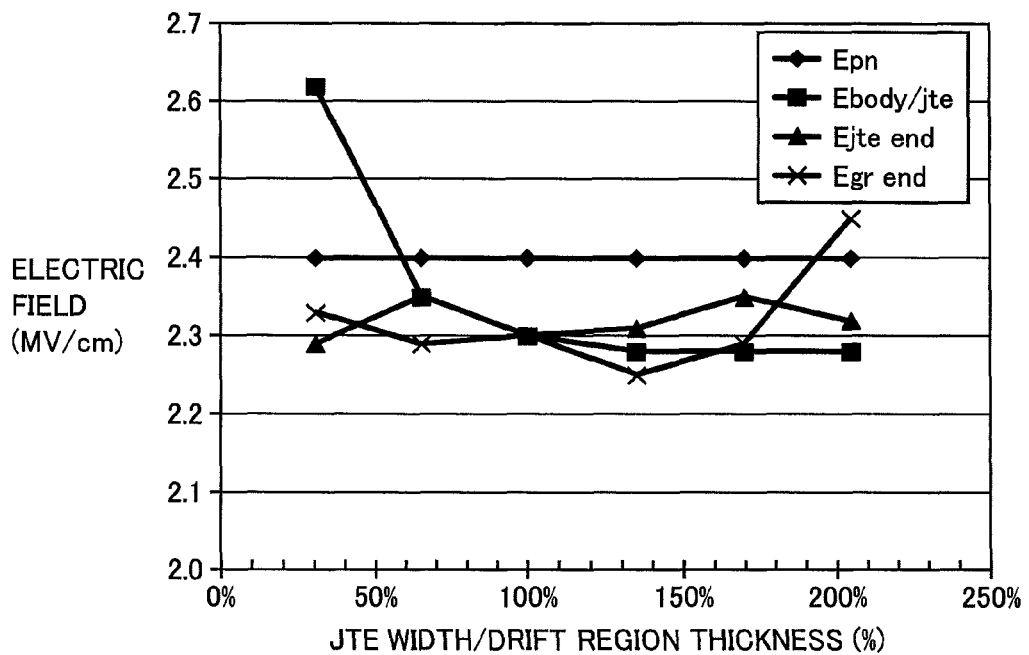
FIG. 17 is a graph showing the relation between electric field strength and a ratio calculated by dividing a JTE width by the thickness of a drift region in a case where a drain voltage is 2.2 kV.

The dependence of the electric field strength on the ratio calculated by dividing width W1 of JTE 2 by thickness T of drift region 12 (expressed in percentage) will be described with reference to FIG. 17. When the ratio calculated by dividing width W1 of JTE 2 by thickness T of drift region 12 is about 30%, the electric field strength at position B ($E_{body/jte}$ in FIG. 17) has a high value. However, when the ratio is more than 30%, the electric field strength at position B is decreased. Further, when the ratio is 204%, the electric field strength at position D ($E_{gr\ end}$ in FIG. 17) has a high value. However, when the ratio is less than 204%, the electric field strength at position D is decreased. That is, it was confirmed that the electric field strength at every position is decreased when the ratio is more than 30% and less than 204%.

It was also confirmed that the electric field strength at position A ($E_{pn}$ in FIG. 17) is higher than the electric field strengths ($E_{body/jte}$, $E_{jte\ end}$, and $E_{gr\ end}$ in FIG. 17) other than the electric field strength at position A when the ratio calculated by dividing width W1 of JTE 2 by thickness T of drift region 12 is not less than 65% and not more than 170%.

Next, eight types of MOSFET models having a structure as shown in FIG. 1 in the embodiment and having changed ratios calculated by dividing width W1 of JTE region 2 by thickness T of drift region 12 were prepared. The impurity concentration in drift region 12 was set to $3.0\times10^{15}$ cm$^{-3}$. Thickness T of the drift region was set to 30 μm. By changing width W1 of JTE region 2 to 7 μm, 15 μm, 23 μm, 31 μm, 39 μm, 47 μm, 55 μm, and 81 μm, the ratios calculated by dividing width W1 of JTE region 2 by thickness T of drift region 12 (expressed in percentage) were set to about 47%, about 50%, 77%, about 103%, about 130%, about 157%, about 183%, and about 237%. The impurity concentration in well region 13 was set to $5\times10^{16}$ cm$^{-3}$. The thickness of well region 13 was set to 0.9 μm. The dose amount in each of JTE region 2 and the guard ring portions was set to $1.35\times10^{13}$ cm$^2$. The thickness of each of JTE region 2 and the guard ring portions was set to 0.7 μm.

The numbers of the guard ring portions when widths W1 of JTE region 2 were set to 7 μm, 15 μm, 23 μm, 31 μm, 39 μm, 47 μm, 55 μm, and 81 μm were set to 16, 15, 14, 13, 12, 11, 10, 9, and 8, respectively. The width of each of the guard ring portions was set to 5 μm. Interval d1 between JTE region 2 and innermost guard ring portion 3a and interval d2 between the adjacent guard ring portions were each set to 5 μm.

Electric field strength distributions in the above eight types of MOSFET models were calculated. An electric field strength at a corner portion of well region 13 (position A), an electric field strength at a contact point between well region 13 and a corner portion of JTE region 2 (position B), an electric field strength at a corner portion of JTE region 2 on the outer peripheral side (position C) in termination region OR of the MOSFET, and an electric field strength at a corner portion of the outermost guard ring portion on the outer peripheral side (position D) were calculated, and the electric field strengths at these positions were estimated. The drain voltage used in calculating the electric field strength distributions was set to 3.3 kV.

Figure 18:
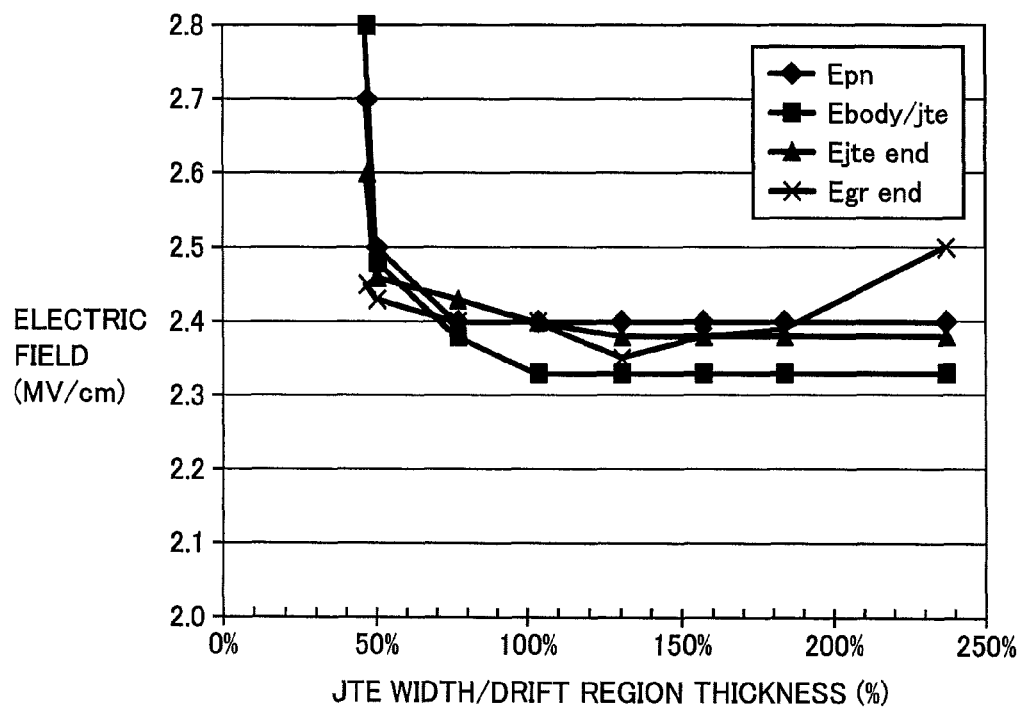
FIG. 18 is a graph showing the relation between electric field strength and the ratio calculated by dividing the JTE width by the thickness of the drift region in a case where the drain voltage is 3.3 kV.

The dependence of the electric field strength on the ratio calculated by dividing width W1 of JTE 2 by thickness T of drift region 12 (expressed in percentage) will be described with reference to FIG. 18. When the ratio calculated by dividing width W1 of JTE 2 by thickness T of drift region 12 is about 47%, the electric field strength at position B ($E_{body/jte}$ in FIG. 18) has a high value. However, when the ratio is not less than 50%, the electric field strength at position B is decreased. Further, when the ratio is 237%, the electric field strength at position D ($E_{gr\ end}$ in FIG. 18) has a high value. However, when the ratio is not more than 183%, the electric field strength at position D is decreased. That is, it was confirmed that the electric field strength at every position is decreased when the ratio is not less than 50% and not more than 183%.

It was also confirmed that the electric field strength at position A ($E_{pn}$ in FIG. 18) is not less than the electric field strengths ($E_{body/jte}$, $E_{jte\ end}$, and $E_{gr\ end}$ in FIG. 18) other than the electric field strength at position A when the ratio calculated by dividing width W1 of JTE 2 by thickness T of drift region 12 is not less than 103% and not more than 183%.

Based on the above results, it was confirmed that the ratio calculated by dividing width W1 of JTE 2 by thickness T of drift region 12 is preferably not less than 50% and not more than 183%, more preferably not less than 103% and not more than 183%, and preferably not less than 65% and not more than 170%.

EXAMPLE 2

In the present example, changes in electric field strength obtained when the number of the guard ring portions was changed was investigated.

Firstly, six types of MOSFET models having a structure as shown in FIG. 1 in the embodiment, having the ratio calculated by dividing width W1 of JTE region 2 by thickness T of drift region 12 fixed to about 65%, and having changed numbers of the guard ring portions were prepared. The numbers of the guard ring portions were set to 2, 3, 6, 9, 12, and 15. The impurity concentration in drift region 12 was set to $4.5\times10^{15}$ cm$^{-3}$. Thickness T of drift region 12 was set to 23 μm. The impurity concentration in well region 13 was set to $5\times10^{16}$ cm$^{-3}$. The thickness of well region 13 was set to 0.9 μm. The dose amount in each of JTE region 2 and the guard ring portions was set to $1.35\times10^{13}$ cm$^{-2}$. The thickness of each of JTE region 2 and the guard ring portions was set to 0.7 μm. The width of each of the guard ring portions was set to 5 μm. Interval d1 between JTE region 2 and innermost guard ring portion 3a and interval d2 between the adjacent guard ring portions were each set to 5 μm.

Electric field strength distributions in the above six types of MOSFET models were calculated. An electric field strength at a corner portion of well region 13 (position A), an electric field strength at a contact point between well region 13 and a corner portion of JTE region 2 (position B), an electric field strength at a corner portion of JTE region 2 on the outer peripheral side (position C) in termination region OR of the MOSFET, and an electric field strength at a corner portion of the outermost guard ring portion on the outer peripheral side (position D) were calculated, and the electric field strengths at these positions were estimated. The drain voltage used in calculating the electric field strength distributions was set to 2.2 kV.

Figure 19:
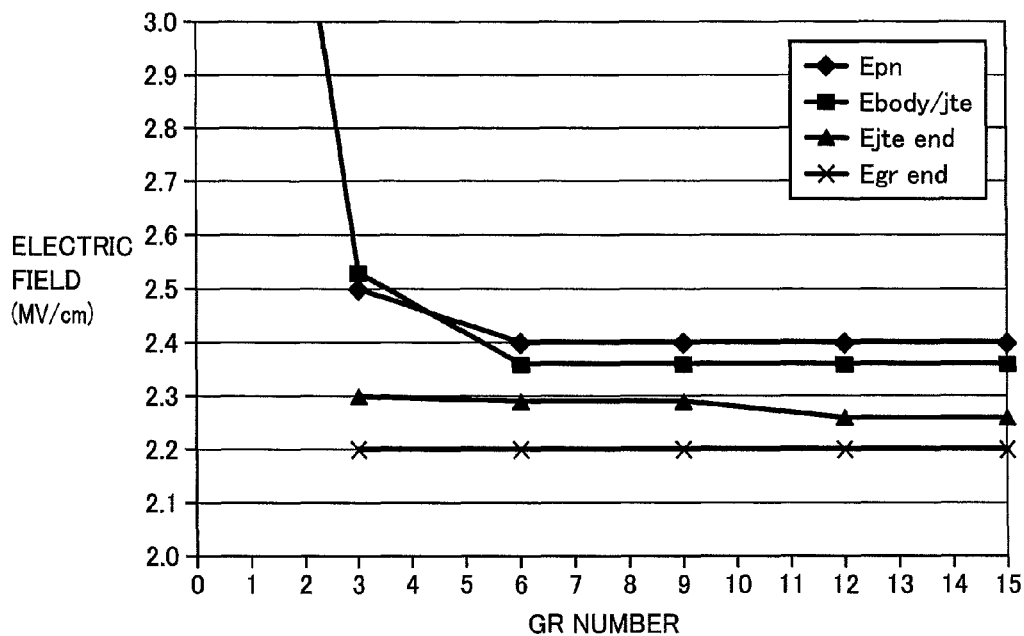
FIG. 19 is a graph showing the relation between electric field strength and the number of guard ring portions in the case where the drain voltage is 2.2 kV.

The dependence of the electric field strength on the number of the guard ring portions (GR number) will be described with reference to FIG. 19. It is noted that, for the MOSFET having two guard ring portions, only the result of the electric field strength at position B is shown. When the number of the guard ring portions is two, the electric field strength at position B ($E_{body/jte}$ in FIG. 19) has a high value of more than 3 MV/cm. However, when the number of the guard ring portions is three or more, the electric field strength at position B is sharply decreased. Further, when the number of the guard ring portions is six or more, the electric field strength at position B is further decreased. Furthermore, it was confirmed that the electric field strength at position A ($E_{pn}$ in FIG. 19) is higher than the electric field strengths ($E_{body/jte}$, $E_{jte\ end}$, and $E_{gr\ end}$ in FIG. 19) other than the electric field strength at position A when the number of the guard ring portions is not less than 6 and not more than 15.

Next, six types of MOSFET models having a structure as shown in FIG. 1 in the embodiment, having the ratio calculated by dividing width W1 of JTE region 2 by thickness T of drift region 12 fixed to about 50%, and having changed numbers of the guard ring portions were prepared. The numbers of the guard ring portions were set to 2, 3, 6, 9, 12, and 15. The impurity concentration in drift region 12 was set to $3.0\times10^{15}$ cm$^{-3}$. Thickness T of the drift region was set to 30 μm. The impurity concentration in well region 13 was set to $5\times10^{16}$ cm$^{-3}$. The thickness of well region 13 was set to 0.9 μm. The dose amount in each of JTE region 2 and the guard ring portions was set to $1.35\times10^{13}$ cm$^{-2}$. The thickness of each of JTE region 2 and the guard ring portions was set to 0.7 μm. The width of each of the guard ring portions was set to 5 μm. Interval d1 between JTE region 2 and innermost guard ring portion 3a and interval d2 between the adjacent guard ring portions were each set to 5 μm.

Electric field strength distributions in the above six types of MOSFET models were calculated. An electric field strength at a corner portion of well region 13 (position A), an electric field strength at a contact point between well region 13 and a corner portion of JTE region 2 (position B), an electric field strength at a corner portion of JTE region 2 on the outer peripheral side (position C) in termination region OR of the MOSFET, and an electric field strength at a corner portion of the outermost guard ring portion on the outer peripheral side (position D) were calculated, and the electric field strengths at these positions were estimated. The drain voltage used in calculating the electric field strength distributions was set to 3.3 kV.

Figure 20:
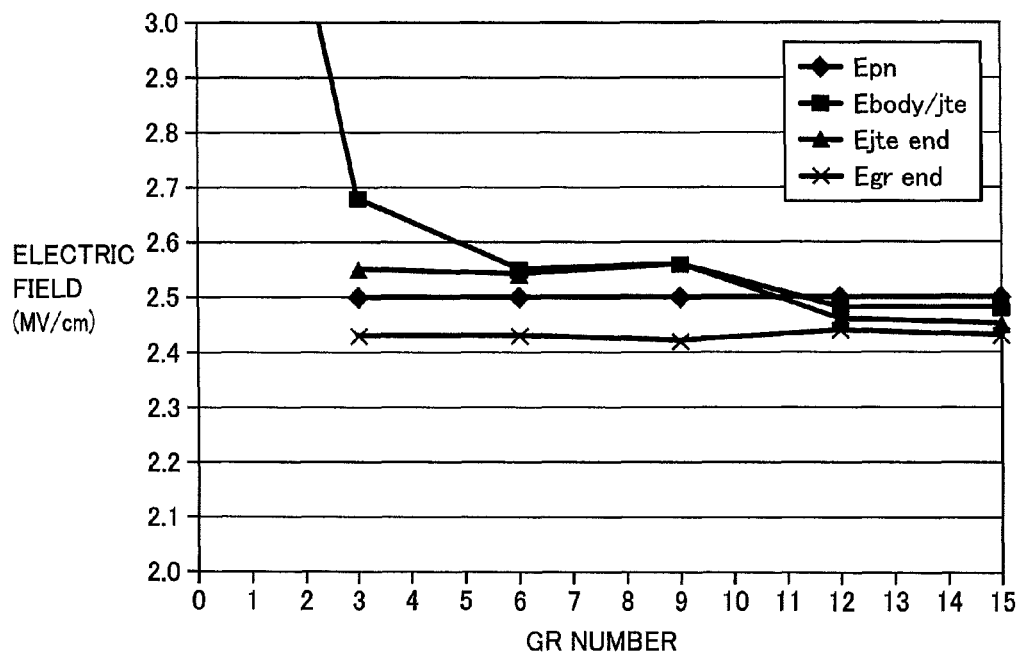
FIG. 20 is a graph showing the relation between electric field strength and the number of guard ring portions in the case where the drain voltage is 3.3 kV.

The dependence of the electric field strength on the number of the guard ring portions (GR number) will be described with reference to FIG. 20. It is noted that, for the MOSFET having two guard ring portions, only the result of the electric field strength at position B is shown. When the number of the guard ring portions is two, the electric field strength at position B ($E_{body/jte}$ in FIG. 20) has a high value of more than 3 MV/cm. However, when the number of the guard ring portions is three or more, the electric field strength at position B is sharply decreased. Further, when the number of the guard ring portions is six or more, the electric field strength at position B is further decreased. Furthermore, when the number of the guard ring portions is 12 or more, the electric field strength at position B is further decreased. It was confirmed that the electric field strength at position A ($E_{pn}$, in FIG. 20) is higher than the electric field strengths ($E_{body/jte}$, $E_{jte\ end}$, and $E_{gr\ end}$ in FIG. 20) other than the electric field strength at position A when the number of the guard ring portions is not less than 12 and not more than 15.

Based on the above results, it was confirmed that the number of the guard ring portions is preferably not less than 3 and not more than 15, more preferably not less than 6 and not more than 15, and further preferably not less than 12 and not more than 15.

EXAMPLE 3

In the present example, an electric field strength distribution of a MOSFET not having second electric field relaxing region 3 (guard ring portions) was investigated. Firstly, six types of MOSFET models not having the guard ring portions and having changed widths W1 of JTE region 2 were prepared. The impurity concentration in drift region 12 was set to $4.5 \times 10^{15}$ cm$^{-3}$. Thickness T of the drift region was set to 23 µm. The impurity concentration in well region 13 was set to $5 \times 10^{16}$ cm$^{-3}$. The thickness of well region 13 was set to 0.9 µm. The dose amount in JTE region 2 was set to $1.35 \times 10^{13}$ cm$^{-2}$. The thickness of JTE region 2 was set to 0.7 µm. Widths W1 of JTE region 2 were set to 7 µm, 15 µm, 23 µm, 31 µm, 39 µm, and 47 µm.

Electric field strength distributions in the above six types of MOSFET models were calculated. An electric field strength at a corner portion of well region 13 (position A), an electric field strength at a contact point between well region 13 and a corner portion of JTE region 2 (position B), and an electric field strength at a corner portion of JTE region 2 on the outer peripheral side (position C) in termination region OR of the MOSFET were calculated, and the electric field strengths at these positions were estimated. The drain voltage used in calculating the electric field strength distributions was set to 2.2 kV.

Figure 21:
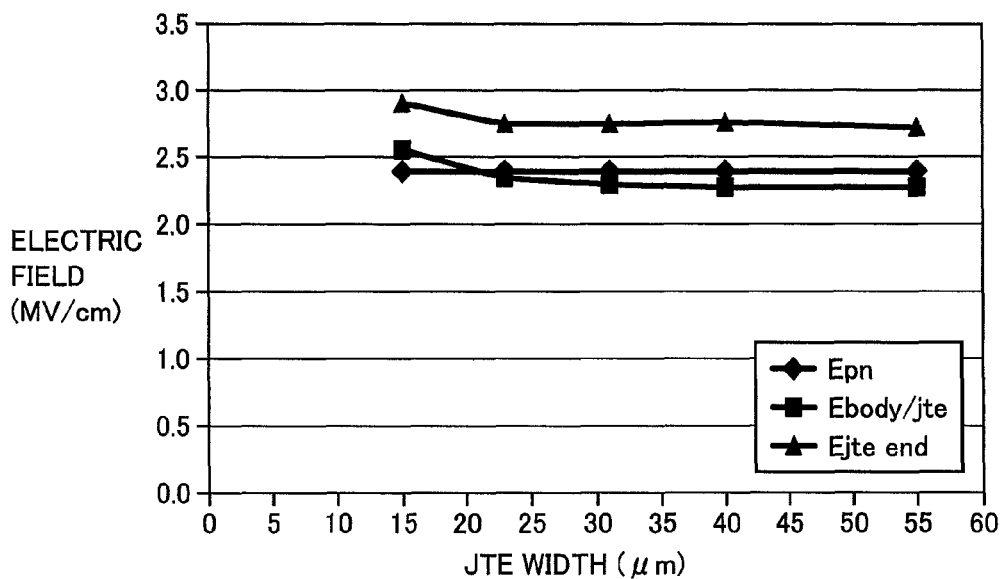
FIG. 21 is a graph showing the relation between electric field strength and the JTE width in a case where the drain voltage is 2.2 kV and guard ring portions are not provided.

The dependence of the electric field strength on width W1 of JTE region 2 will be described with reference to FIG. 21. It was confirmed that, in a range where width W1 of JTE region 2 is not less than 15 µm and not more than 55 µm, the electric field strength at position A ($E_{pn}$ in FIG. 21) is lower than the electric field strength at position C ($E_{jte\ end}$ in FIG. 21). Further, in the range where width W1 of JTE region 2 is not less than 15 µm and not more than 55 µm, the electric field strength at position C ($E_{jte\ end}$ in FIG. 21) has a high value of more than 2.7 MV/cm. In contrast, referring to FIG. 17, the electric field strength at position C ($E_{jte\ end}$ in FIG. 17) of the MOSFET having the guard ring portions is less than 2.4 MV/cm. That is, it was confirmed that the electric field strength at position C can be decreased more in the MOSFET having the guard ring portions than in the MOSFET not having the guard ring portions.

EXAMPLE 4

In the present example, an electric field strength distribution obtained when the widths of the plurality of guard ring portions were changed was investigated. Firstly, as a comparative example, a MOSFET having JTE region 2 and the plurality of guard ring portions, and having a structure in which each of the plurality of guard ring portions had a constant width was prepared. Specifically, as a comparative example, a MOSFET having the structure of FIG. 3 was prepared. Width W1 of JTE region 2 of the MOSFET in accordance with FIG. 22 was set to 15 µm. Second electric field relaxing region 3 included nine guard ring portions. The width of each of the guard ring portions was set to 5 µm. Interval d1 between JTE region 2 and the innermost guard ring portion was set to 3 µm. Interval d2 between the adjacent guard ring portions was set to 3 µm.

In contrast, as the present invention's examples, MOSFETs each having JTE region 2 and the plurality of guard ring portions, and having a structure in which the plurality of guard ring portions had widths which became smaller from the center of silicon carbide substrate 10 toward the outer periphery thereof were prepared. Specifically, as the present invention's examples, MOSFETs having the structure of FIG. 4 were prepared. Width W1 of JTE region 2 of a MOSFET in accordance with FIG. 23 was set to 15 µm. Second electric field relaxing region 3 included seven guard ring portions. The widths of the guard ring portions were set to 10 µm, 8 µm, 8 µm, 6 µm, 5 µm, 5 µm, and 5 µm, from the inner peripheral side toward the outer peripheral side. Width W1 of JTE region 2 of a MOSFET in accordance with FIG. 24 was set to 20 µm. Second electric field relaxing region 3 included six guard ring portions. The widths of the guard ring portions were set to 15 µm, 10 µm, 5 µm, 5 µm, and 5 µm, from the inner peripheral side toward the outer peripheral side. Width W1 of JTE region 2 of a MOSFET in accordance with FIG. 25 was set to 20 µm. Second electric field relaxing region 3 included six guard ring portions. The widths of the guard ring portions were set to 15 µm, 12 µm, 8 µm, 5 µm, 5 µm, and 5 µm, from the inner peripheral side toward the outer peripheral side. It is noted that interval d1 between JTE region 2 and second electric field relaxing region 3 was set to 3 µm. Interval d2 between the adjacent guard ring portions was set to 3 µm.

Next, a simulation of electric field strength distributions in the comparative example and the present invention's examples was performed. FIGS. 22 to 25 show results of the electric field strength distributions. It is noted that the same type of hatching in FIGS. 22 to 25 indicates the same degree of electric field strength.

Figure 22:
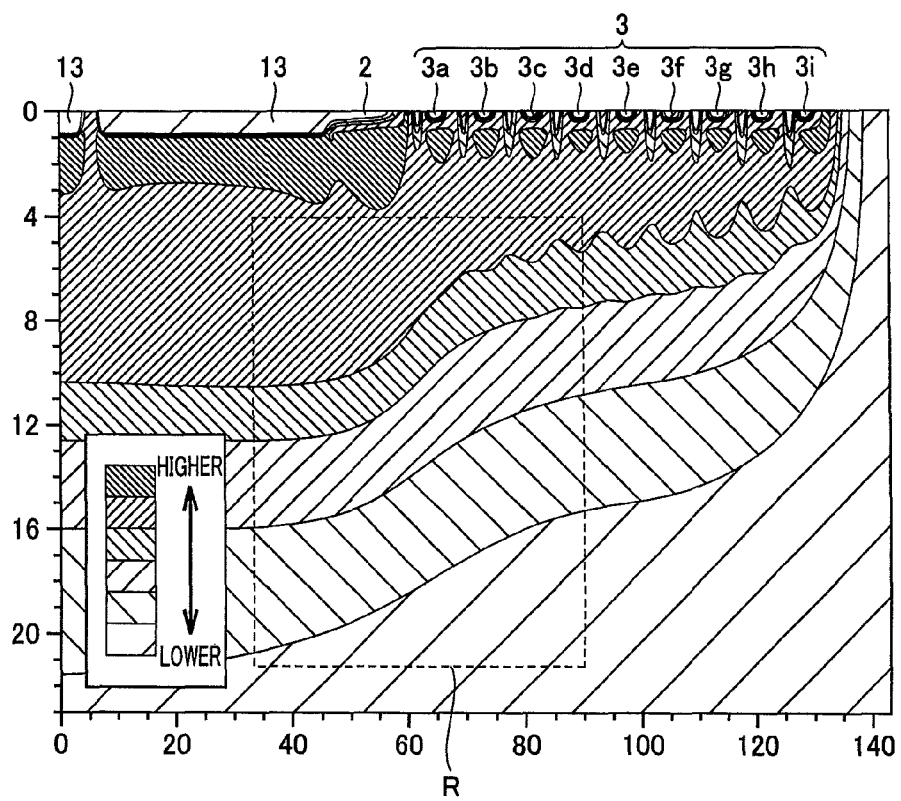
FIG. 22 is a view showing an electric field strength distribution in a case where each of a plurality of guard ring portions has the same width.
Figure 23:
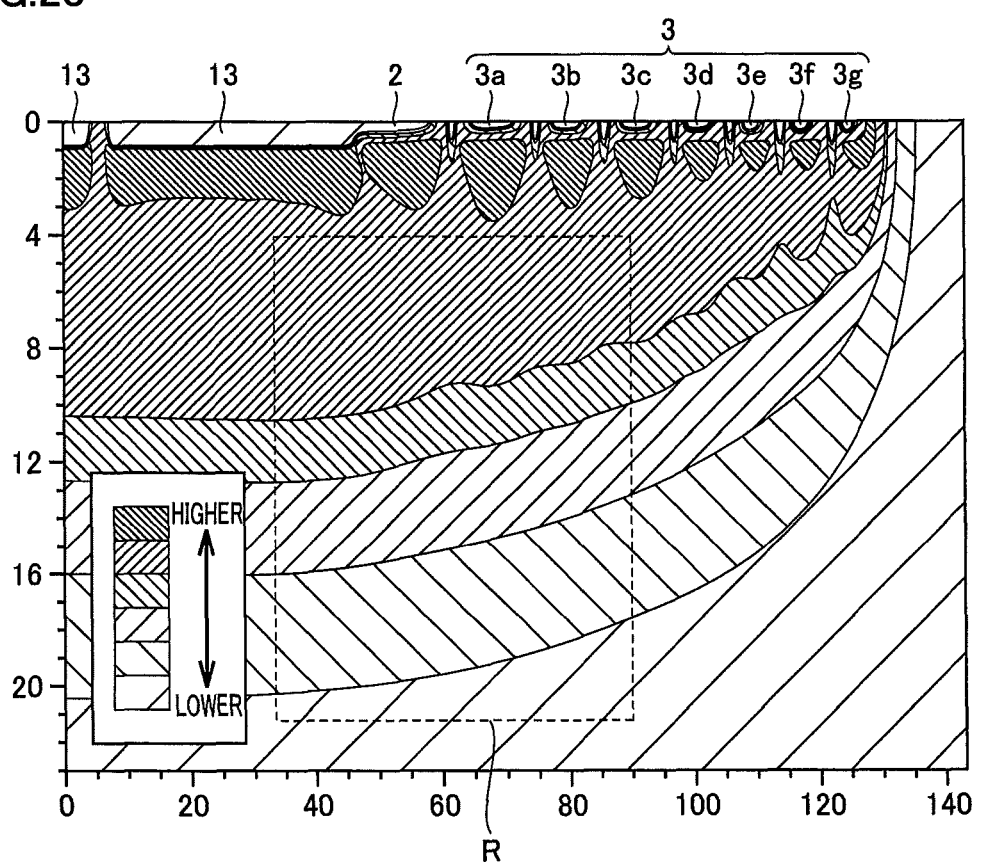
FIG. 23 is a view showing an electric field strength distribution in a first case where the plurality of guard ring portions have widths which become smaller toward an outer peripheral side.
Figure 24:
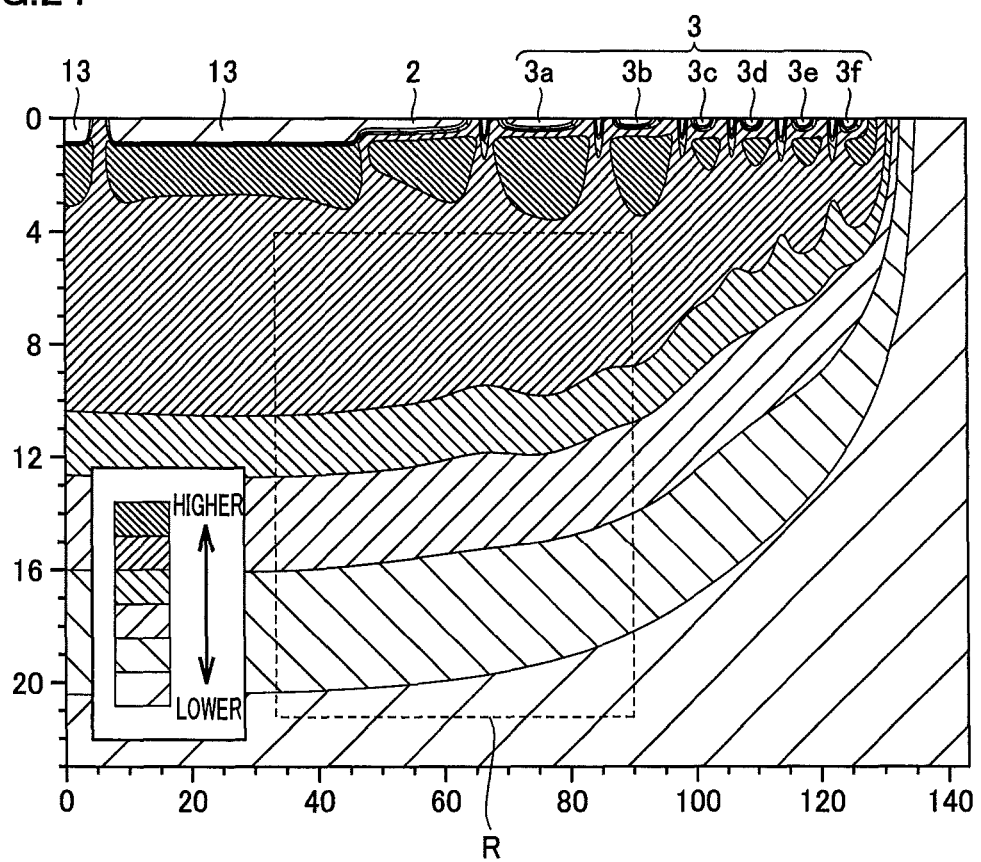
FIG. 24 is a view showing an electric field strength distribution in a second case where the plurality of guard ring portions have widths which become smaller toward the outer peripheral side.
Figure 25:
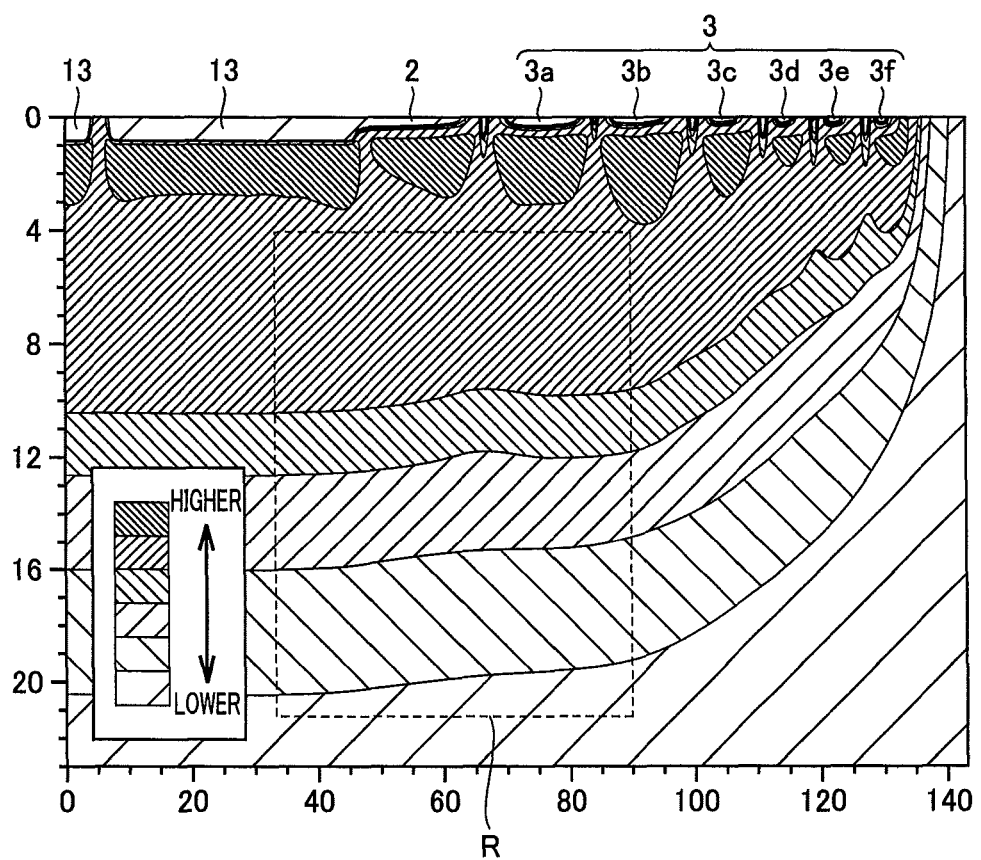
FIG. 25 is a view showing an electric field strength distribution in a third case where the plurality of guard ring portions have widths which become smaller toward the outer peripheral side.

FIG. 22 shows the electric field strength distribution in the comparative example, whereas FIGS. 23 to 25 show the electric field strength distributions in the present invention's examples. A numeral on the axis of abscissas indicates a position in the direction parallel to first main surface 10a of silicon carbide substrate 10, and a numeral on the axis of ordinates indicates a position in the direction of the normal to first main surface 10a. The numerals on the axis of ordinates and on the axis of abscissas are indicated in micrometers (μm).

Referring to FIG. 22, electric field contour lines are sharply changed in the vicinity of a boundary between JTE region 2 and second electric field relaxing region 3 (a region R in the drawing) in the comparative example. For example, at a position 8 μm away from first main surface 10a, the electric field strength is sharply decreased in the direction from the center of silicon carbide substrate 10 toward the outer periphery thereof (i.e., in a rightward direction in FIG. 22). In contrast, referring to FIGS. 23 to 25, electric field contour lines are moderately changed in the vicinity of the boundary between first electric field relaxing region 2 and second electric field relaxing region 3 (region R in the drawing) in the present invention's examples. For example, at a position 8 μm away from first main surface 10a, the electric field strength is moderately decreased in the direction from the center of silicon carbide substrate 10 toward the outer periphery thereof (i.e., in a rightward direction in FIGS. 23 to 25).

Based on the above results, it was confirmed that the electric field contour lines in the direction from the center of silicon carbide substrate 10 toward the outer periphery thereof are moderately changed in the MOSFET having the structure in which the plurality of guard ring portions have widths which become smaller from the center of silicon carbide substrate 10 toward the outer periphery thereof, when compared with the MOSFET having the structure in which each of the plurality of guard ring portions has the same width. It is noted that breakdown voltage life (reliability) when a voltage is repeatedly applied can be improved in the MOSFET having moderately changed electric field contour lines, when compared with the MOSFET having sharply changed electric field contour lines.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A silicon carbide semiconductor device, comprising a silicon carbide substrate composed of an element region provided with a semiconductor element portion and a termination region surrounding said element region as viewed in a plan view, said semiconductor element portion including a drift region having a first conductivity type, said termination region including
a first electric field relaxing region contacting said element region and having a second conductivity type different from said first conductivity type, and
a second electric field relaxing region arranged outside said first electric field relaxing region as viewed in said plan view, having said second conductivity type, and spaced from said first electric field relaxing region, a ratio calculated by dividing a width of said first electric field relaxing region by a thickness of said drift region being not less than 0.5 and not more than 1.83, wherein said second electric field relaxing region includes a plurality of guard ring portions, and wherein, in a case where any two guard ring portions are selected from among said plurality of guard ring portions, the guard ring portion arranged on an outer peripheral side as viewed in the plan view has a width which is not more than that of the guard ring portion arranged on an inner peripheral side, and the guard ring portion arranged on an outermost peripheral side has a width which is smaller than that of the guard ring portion arranged on an innermost peripheral side.

2. The silicon carbide semiconductor device according to claim 1, wherein each of said plurality of guard ring portions has a width smaller than the width of said first electric field relaxing region.

3. The silicon carbide semiconductor device according to claim 1, wherein the number of said plurality of guard ring portions is not less than 6 and not more than 15.

4. The silicon carbide semiconductor device according to claim 3, wherein the number of said plurality of guard ring portions is not less than 12 and not more than 15.

5. The silicon carbide semiconductor device according to claim 1, wherein said silicon carbide semiconductor device is any of a MOSFET, an IGBT, a schottky barrier diode, and a P/N diode.

* * * * *